(12) United States Patent
Yamashita et al.

(10) Patent No.: US 9,335,075 B2
(45) Date of Patent: May 10, 2016

(54) AIR-CONDITIONING APPARATUS

(75) Inventors: Koji Yamashita, Tokyo (JP); Junichi Ue, Tokyo (JP); Hiroyuki Morimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 317 days.

(21) Appl. No.: 13/814,289

(22) PCT Filed: Sep. 10, 2010

(86) PCT No.: PCT/JP2010/005535
§ 371 (c)(1),
(2), (4) Date: Feb. 5, 2013

(87) PCT Pub. No.: WO2012/032580
PCT Pub. Date: Mar. 15, 2012

(65) Prior Publication Data
US 2013/0133361 A1    May 30, 2013

(51) Int. Cl.
| | | |
|---|---|---|
| F25D 17/00 | (2006.01) |
| F25B 29/00 | (2006.01) |
| F25B 25/00 | (2006.01) |
| F25B 5/00 | (2006.01) |
| F25B 41/00 | (2006.01) |
| F25B 49/02 | (2006.01) |
| F25B 7/00 | (2006.01) |
| F25B 13/00 | (2006.01) |
| F24F 3/06 | (2006.01) |
| F24D 19/10 | (2006.01) |
| H05K 7/20 | (2006.01) |
| F25B 27/00 | (2006.01) |
| F24D 17/02 | (2006.01) |

(52) U.S. Cl.
CPC .......... *F25B 29/003* (2013.01); *F24D 19/1054* (2013.01); *F24F 3/065* (2013.01); *F25B 5/00* (2013.01); *F25B 7/00* (2013.01); *F25B 13/00* (2013.01); *F25B 25/00* (2013.01); *F25B 25/005* (2013.01); *F25B 41/00* (2013.01); *F25B 49/02* (2013.01); *H05K 7/20836* (2013.01); *F24D 17/02* (2013.01); *F24D 2200/123* (2013.01);

(Continued)

(58) Field of Classification Search
CPC .......... F25B 25/00; F25B 25/005; F25B 7/00; F25B 29/003; F25B 13/00
USPC ...................... 62/332, 333, 335, 238.6, 238.7
See application file for complete search history.

(56) References Cited

U.S. PATENT DOCUMENTS 6,298,677 B1 * 10/2001 Bujak, Jr. ..................... 62/158
6,536,225 B1 *  3/2003 Yajima ............................ 62/407

(Continued)

FOREIGN PATENT DOCUMENTS

| JP | 03-013749 A | 1/1991 |
| JP | 05-280818 A | 10/1993 |

(Continued)

OTHER PUBLICATIONS

International Search Report of the International Searching Authority mailed Nov. 16, 2010 for the corresponding international application No. PCT/JP2010/005535 (with English translation).

*Primary Examiner* — Marc Norman
*Assistant Examiner* — David Teitelbaum
(74) *Attorney, Agent, or Firm* — Posz Law Group, PLC

(57) ABSTRACT

An air-conditioning apparatus once transfers energy to a heat medium other than a refrigerant and introduces the heat medium to another refrigeration cycle to achieve safety improvement and high efficiency. An air-conditioning apparatus allows first heat exchangers related to heat medium to exchange heat between a first refrigerant (heat source side refrigerant) and a first heat medium and allows a second heat exchanger related to heat medium to exchange heat between the first heat medium and a second refrigerant (hot water supply side refrigerant), such that the first refrigerant and the second refrigerant are prevented from mixing with each other.

10 Claims, 6 Drawing Sheets

(52) U.S. Cl.
CPC ......... *F25B 27/005* (2013.01); *F25B 2309/061* (2013.01); *F25B 2313/023* (2013.01); *F25B 2313/0272* (2013.01); *F25B 2313/02732* (2013.01); *F25B 2313/02741* (2013.01)

(56) References Cited

U.S. PATENT DOCUMENTS

| | | | |
|---|---|---|---|
| 7,503,185 B2 * | 3/2009 | Narayanamurthy et al. | ... 62/332 |
| 2005/0210901 A1 * | 9/2005 | Nash, Jr. | ... 62/228.5 |
| 2006/0107683 A1 * | 5/2006 | Song et al. | ... 62/324.1 |
| 2006/0218948 A1 * | 10/2006 | Otake et al. | ... 62/160 |
| 2008/0053142 A1 * | 3/2008 | Park et al. | ... 62/434 |
| 2008/0203349 A1 * | 8/2008 | Singh et al. | ... 252/3 |
| 2009/0145151 A1 * | 6/2009 | Wakamoto et al. | ... 62/259.1 |
| 2009/0211282 A1 * | 8/2009 | Nishimura et al. | ... 62/238.6 |

FOREIGN PATENT DOCUMENTS

| | | |
|---|---|---|
| JP | 2001-289465 A | 10/2001 |
| JP | 2003-343936 A | 12/2003 |
| JP | 2005-140444 A | 6/2005 |
| JP | 2009-243768 A | 10/2009 |
| JP | 2010-112693 A | 5/2010 |
| WO | 2009/098751 A1 | 8/2009 |
| WO | 2010/049998 A1 | 5/2010 |
| WO | 2010/050007 A1 | 5/2010 |

* cited by examiner

AIR-CONDITIONING APPARATUS

CROSS REFERENCE TO RELATED APPLICATIONS

This application is a U.S. national stage application of PCT/JP2010/005535 filed on Sep. 10, 2010, the disclosure of which is incorporated herein by reference.

TECHNICAL FIELD

The present invention relates to an air-conditioning apparatus which is applied to, for example, a multi-air-conditioning apparatus for a building.

BACKGROUND

In a related-art air-conditioning apparatus, such as a multi-air-conditioning apparatus for a building, a refrigerant is circulated between an outdoor unit, functioning as a heat source unit, disposed outside a structure, for example, and an indoor unit disposed in an indoor space in the structure. The refrigerant transfers heat or removes heat to heat or cool air, thus heating or cooling a conditioned space with the heated or cooled air. As regards the refrigerant used in such an air-conditioning apparatus, for example, an HFC (hydrofluorocarbon) refrigerant is often used. An air-conditioning apparatus recently developed uses a natural refrigerant, such as carbon dioxide ($CO_2$).

In an air-conditioning apparatus called a chiller, cooling energy or heating energy is produced in a heat source unit disposed outside a structure. Water, antifreeze, or the like is heated or cooled by a heat exchanger disposed in an outdoor unit and it is conveyed to an indoor unit, such as a fan coil unit or a panel heater, to perform heating or cooling (refer to Patent Literature 1, for example).

An air-conditioning apparatus called a waste heat recovery chiller is constructed such that a heat source unit is connected to each indoor unit by four water pipes arranged therebetween and, for example, cooled water and heated water are simultaneously supplied so that cooling or heating can be freely selected in the indoor unit (refer to Patent Literature 2, for example).

Another air-conditioning apparatus recently developed is constructed such that a heat exchanger for a primary refrigerant and a secondary refrigerant is disposed near each indoor unit to convey the secondary refrigerant to the indoor unit (refer to Patent Literature 3, for example).

Another air-conditioning apparatus recently developed is constructed such that an outdoor unit is connected to each branching unit including a heat exchanger by two pipes to convey a secondary refrigerant to an indoor unit (refer to Patent Literature 4, for example).

Air-conditioning apparatuses, such as a multi-air-conditioning apparatus for a building, include an air-conditioning apparatus constructed such that a refrigerant is circulated from an outdoor unit to a relay unit and a heat medium, such as water, is circulated from the relay unit to each indoor unit to reduce conveyance power for the heat medium while circulating the heat medium, such as water, through the indoor unit (refer to Patent Literature 5, for example).

A system (for example, an air-conditioning and hot water supply combined system) recently developed is constructed such that a first refrigeration cycle, such as a multi-air-conditioning apparatus for a building, and a second refrigerant cycle allow heat exchange to produce hot water (refer to Patent Literature 6, for example).

CITATION LIST

Patent Literature

Patent Literature 1: Japanese Unexamined Patent Application Publication No. 2005-140444 (Page 4, FIG. 1, for example)
Patent Literature 2: Japanese Unexamined Patent Application Publication No. 5-280818 (Pages 4 and 5, FIG. 1, for example)
Patent Literature 3: Japanese Unexamined Patent Application Publication No. 2001-289465 (Pages 5 to 8, FIGS. 1 and 2, for example)
Patent Literature 4: Japanese Unexamined Patent Application Publication No. 2003-343936 (Page 5, FIG. 1, for example)
Patent Literature 5: International Publication No. WO10/049,998 (Page 3, FIG. 1, for example)
Patent Literature 6: International Publication No. WO2009/098751 (Page 5, FIG. 1, for example)

SUMMARY OF INVENTION

In a related-art air-conditioning apparatus, such as a multi-air-conditioning apparatus for a building, a refrigerant may leak into, for example, an indoor space because the refrigerant is circulated up to an indoor unit. On the other hand, in an air-conditioning apparatus like those disclosed in Patent Literature 1 and Patent Literature 2, the refrigerant does not pass through an indoor unit. It is however necessary to heat or cool a heat medium in a heat source unit disposed outside a structure and convey it to the indoor unit in the air-conditioning apparatus like those disclosed in Patent Literature 1 and Patent Literature 2. Accordingly, a circulation path for the heat medium is long. In this case, in conveying heat for a predetermined heating or cooling work using the heat medium, the amount of energy consumed as conveyance power and the like by the heat medium is higher than that by the refrigerant. As the circulation path is longer, therefore, the conveyance power markedly increases. This indicates that energy saving is achieved as long as the circulation of the heat medium can be properly controlled in the air-conditioning apparatus.

In an air-conditioning apparatus like that disclosed in Patent Literature 2, four pipes have to be connected between an outdoor side and each indoor space so that cooling or heating can be selected in each indoor unit. Disadvantageously, ease of construction is poor. In the air-conditioning apparatus disclosed in Patent Literature 3, secondary medium circulating means, such as a pump, has to be provided for each indoor unit. Disadvantageously, the cost of such a system is high and noise is also large. This apparatus is not practical. In addition, since the heat exchanger is placed near each indoor unit, the risk of leakage of the refrigerant into a place near an indoor space cannot be eliminated.

In an air-conditioning apparatus like that disclosed in Patent Literature 4, a primary refrigerant subjected to heat exchange flows into the same passage as that for the primary refrigerant to be subjected to heat exchange. In the case where a plurality of indoor units are connected, it is difficult for each indoor unit to exhibit a maximum capacity. Such a configuration wastes energy. Furthermore, each branching unit is connected to an extension pipe by two pipes for cooling and two pipes for heating, namely, four pipes in total. Consequently, this configuration is similar to that of a system in which the outdoor unit is connected to each branching unit by four pipes. Accordingly, the ease of construction of such a system is poor.

An air-conditioning apparatus like that disclosed in Patent Literature 5 includes a plurality of refrigerant to heat medium heat exchangers and can simultaneously produce cold water and hot water without introducing the refrigerant directly into an indoor space but cannot produce high-temperature hot water used for hot water supply.

In an air-conditioning and hot water supply combined system like that disclosed in Patent Literature 6, a first refrigeration cycle, such as a multi-air-conditioning apparatus for a building, is connected to a second refrigeration cycle and the cycles allow heat exchange. While a refrigerant flowing in the first refrigeration cycle is undergoing a two-phase change, a constant temperature is held. It is therefore unnecessary to require attention to temperature gradient in each heat exchanger. If a refrigerant that changes in temperature or another heat medium is used, however, the amount of heat exchanged would be reduced due to a change in temperature. Unfortunately, performance would be reduced.

It is preferable to condition air in a water-hating conditioned space, such as a computer room, using a refrigerant rather than a heat medium, such as water. To condition air using a direct expansion air-conditioning apparatus, such as a multi-air-conditioning apparatus for a building, however, it is necessary to take additional measures against refrigerant leakage.

The present invention has been made to overcome at least one of the above-described disadvantages and provides an air-conditioning apparatus capable of achieving energy saving. Some aspects of the present invention provide an air-conditioning apparatus capable of achieving safety improvement without allowing a refrigerant to circulate in or near an indoor unit. Some aspects of the present invention provide an air-conditioning apparatus that includes a reduced number of pipes connecting an outdoor unit and a branching unit (heat medium relay unit) or connecting the branching unit and an indoor unit to provide improved ease of construction and improved energy efficiency. Some aspects of the present invention provide an air-conditioning apparatus that once transfers energy to a heat medium other than a refrigerant and then introduces the heat medium to another refrigeration cycle to achieve safety improvement and high efficiency.

Solution to Problem

The present invention provides an air-conditioning apparatus including a first refrigerant circuit in which a first compressor, a first refrigerant flow switching device, a heat source side heat exchanger, a plurality of first expansion devices, and refrigerant side passages of a plurality of first heat exchangers related to heat medium are connected by refrigerant pipes to circulate a first refrigerant, a first heat medium circuit in which a pump, a use side heat exchanger, heat medium side passages of the plurality of first heat exchangers related to heat medium, a heat medium flow control device disposed on an inlet side or an outlet side of the use side heat exchanger, and heat medium flow switching devices arranged on the inlet side and the outlet side of the use side heat exchanger are connected by heat medium pipes, and the pump, a heat medium side passage of a second heat exchanger related to heat medium, the heat medium side passages of the plurality of first heat exchangers related to heat medium, a heat medium flow control device disposed on an inlet side or an outlet side of the heat medium side passage of the second heat exchanger related to heat medium, and heat medium flow switching devices arranged on the inlet side and the outlet side of the heat medium side passage of the second heat exchanger related to heat medium are connected by heat medium pipes to circulate a first heat medium, and a second refrigerant circuit in which a second compressor, a refrigerant side passage of a third heat exchanger related to heat medium (15), a second expansion device, and a refrigerant side passage of the second heat exchanger related to heat medium are connected by refrigerant pipes to circulate a second refrigerant, wherein the plurality of first heat exchangers related to heat medium exchange heat between the first refrigerant and the first heat medium and the second heat exchanger related to heat medium exchanges heat between the first heat medium and the second refrigerant to prevent the first refrigerant and the second refrigerant from mixing with each other, wherein a second heat medium is allowed to flow through a heat medium side passage of the third heat exchanger related to heat medium, wherein the third heat exchanger related to heat medium exchanges heat between the second refrigerant and the second heat medium to prevent the first heat medium and the second heat medium from mixing with each other, wherein the first refrigerant and the second refrigerant undergo a two-phase change or a transition to a supercritical state during circulating in the first refrigerant circuit and the second refrigerant circuit, respectively, and wherein the first heat medium and a second heat medium do not undergo a two-phase change or a transition to a supercritical state during circulating in the first heat medium circuit and circulating through the heat medium side passage of the third heat exchanger related to heat medium, respectively.

Since the air-conditioning apparatus according to the present invention requires less conveyance power because pipes through which the heat medium circulates can be shortened, the apparatus can achieve energy saving. In addition, if the heat medium leaks to the outside of the air-conditioning apparatus according to the present invention, a small amount of heat medium would leak. Accordingly, safety improvement can be achieved. Furthermore, the air-conditioning apparatus according to the present invention can provide improved ease of construction. Moreover, the air-conditioning apparatus according to the present invention once transfers energy to a heat medium other than a refrigerant and then introduces the heat medium into another refrigeration cycle to achieve safety improvement and high efficiency if the other refrigeration cycle is used for air-conditioning of a water-hating air-conditioned space, such as a computer room, or hot water supply.

DETAILED DESCRIPTION

Embodiment of the present invention will be described below with reference to the drawings.

Figure 1:
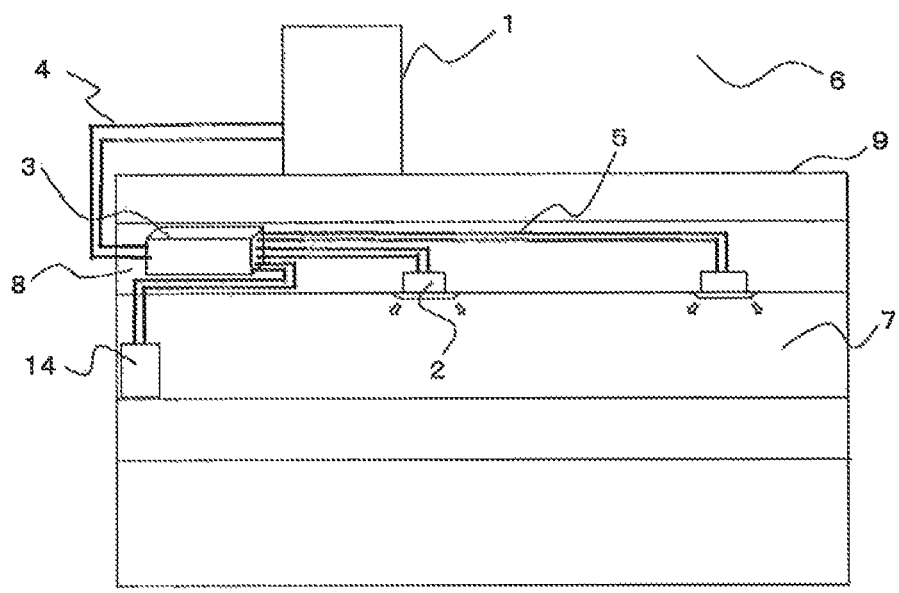
FIG. 1 is a schematic diagram illustrating an example of installation of an air-conditioning apparatus according to Embodiment of the present invention.

FIG. 1 is a schematic diagram illustrating an example of installation of an air-conditioning apparatus according to Embodiment of the present invention. The example of installation of the air-conditioning apparatus will be described with reference to FIG. 1. This air-conditioning apparatus uses refrigeration cycles (a refrigerant circuit A and a heat medium circuit B), through each of which a refrigerant (a heat source side refrigerant (first refrigerant) or a heat medium (first heat medium)) is circulated, to permit each indoor unit to freely select a cooling mode or a heating mode as an operation mode and enable a hot water supply unit to produce hot water. Note that the dimensional relationship among components in FIG. 1 and the other figures may be different from the actual one.

Referring to FIG. 1, the air-conditioning apparatus according to Embodiment includes a single outdoor unit 1, functioning as a heat source unit, a plurality of indoor units 2, a heat medium relay unit 3 disposed between the outdoor unit 1 and load side units (the indoor units 2 and a hot water supply unit 14), and the hot water supply unit 14. The heat medium relay unit 3 is configured to exchange heat between the heat source side refrigerant and the heat medium. The outdoor unit 1 is connected to the heat medium relay unit 3 by refrigerant pipes 4 through which the heat source side refrigerant is conveyed. The heat medium relay unit 3 is connected to each indoor unit 2 by pipes (heat medium pipes) 5 through which the heat medium is conveyed. The hot water supply unit 14, which is disposed in parallel with the indoor units 2, is connected to the heat medium relay unit 3 by the pipes (heat medium pipes) 5 through which the heat medium is conveyed in a manner similar to the indoor units 2. Cooling energy or heating energy produced in the outdoor unit 1 is delivered through the heat medium relay unit 3 to the indoor units 2 and the hot water supply unit 14.

The outdoor unit 1, typically disposed in an outdoor space 6 which is a space (e.g., a roof) outside a structure 9, such as a building, is configured to supply cooling energy or heating energy through the heat medium relay unit 3 to the indoor units 2. Each indoor unit 2 is disposed at a position such that it can supply cooling air or heating air to an indoor space 7 which is a space (e.g., a living room) inside the structure 9 and is configured to supply the cooling air or heating air to the indoor space 7, serving as a conditioned space. The heat medium relay unit 3 is configured so as to include a housing separated from housings of the outdoor unit 1 and the indoor units 2 such that the heat medium relay unit 3 can be disposed at a position different from those of the outdoor space 6 and the indoor space 7, and is connected to the outdoor unit 1 through the refrigerant pipes 4 and is connected to the indoor units 2 through the pipes 5 to transfer cooling energy or heating energy, supplied from the outdoor unit 1, to the indoor units 2. The hot water supply unit 14 is disposed in any position inside the structure 9 and is configured to supply hot water to a load side for hot water supply, for example.

As illustrated in FIG. 1, in the air-conditioning apparatus according to Embodiment, the outdoor unit 1 is connected to the heat medium relay unit 3 using two refrigerant pipes 4 and the heat medium relay unit 3 is connected to each load side unit using two pipes 5. As described above, in the air-conditioning apparatus according to Embodiment, each of the units (the outdoor unit 1, the indoor units 2, the hot water supply unit 14, and the heat medium relay unit 3) is connected using two pipes (the refrigerant pipes 4 or the pipes 5), thus facilitating construction.

FIG. 1 illustrates a state where the heat medium relay unit 3 is disposed in a space different from the indoor space 7, for example, a space above a ceiling (hereinafter, simply referred to as a "space 8") inside the structure 9. The heat medium relay unit 3 can be placed in another space, for example, a common space where an elevator or the like is installed. Furthermore, although FIG. 1 illustrates a case where the indoor units 2 are of a ceiling cassette type, the indoor units are not limited to this type and may be of any type, such as a ceiling concealed type or a ceiling suspended type, capable of blowing out heating air or cooling air into the indoor space 7 directly or through a duct or the like.

Although FIG. 1 illustrates the case where the outdoor unit 1 is disposed in the outdoor space 6, the arrangement is not limited to this case. For example, the outdoor unit 1 may be disposed in an enclosed space, for example, a machine room with a ventilation opening, may be disposed inside the structure 9 as long as waste heat can be exhausted through an exhaust duct to the outside of the structure 9, or may be disposed inside the structure 9 in the use of the outdoor unit 1 of a water-cooled type. Even when the outdoor unit 1 is disposed in such a place, no problem in particular will occur.

Furthermore, the heat medium relay unit 3 can be disposed near the outdoor unit 1. If the distance between the heat medium relay unit 3 and each indoor unit 2 is too long, the conveyance power for the heat medium would be considerably large. It should be therefore noted that the effect of energy saving is reduced in this case. In addition, the number of outdoor units 1, the number of indoor units 2, the number of hot water supply units 14, and the number of heat medium relay units 3 which are connected are not limited to the numbers illustrated in FIG. 1. The numbers may be determined depending on the structure 9 where the air-conditioning apparatus according to Embodiment is installed.

Figure 2:
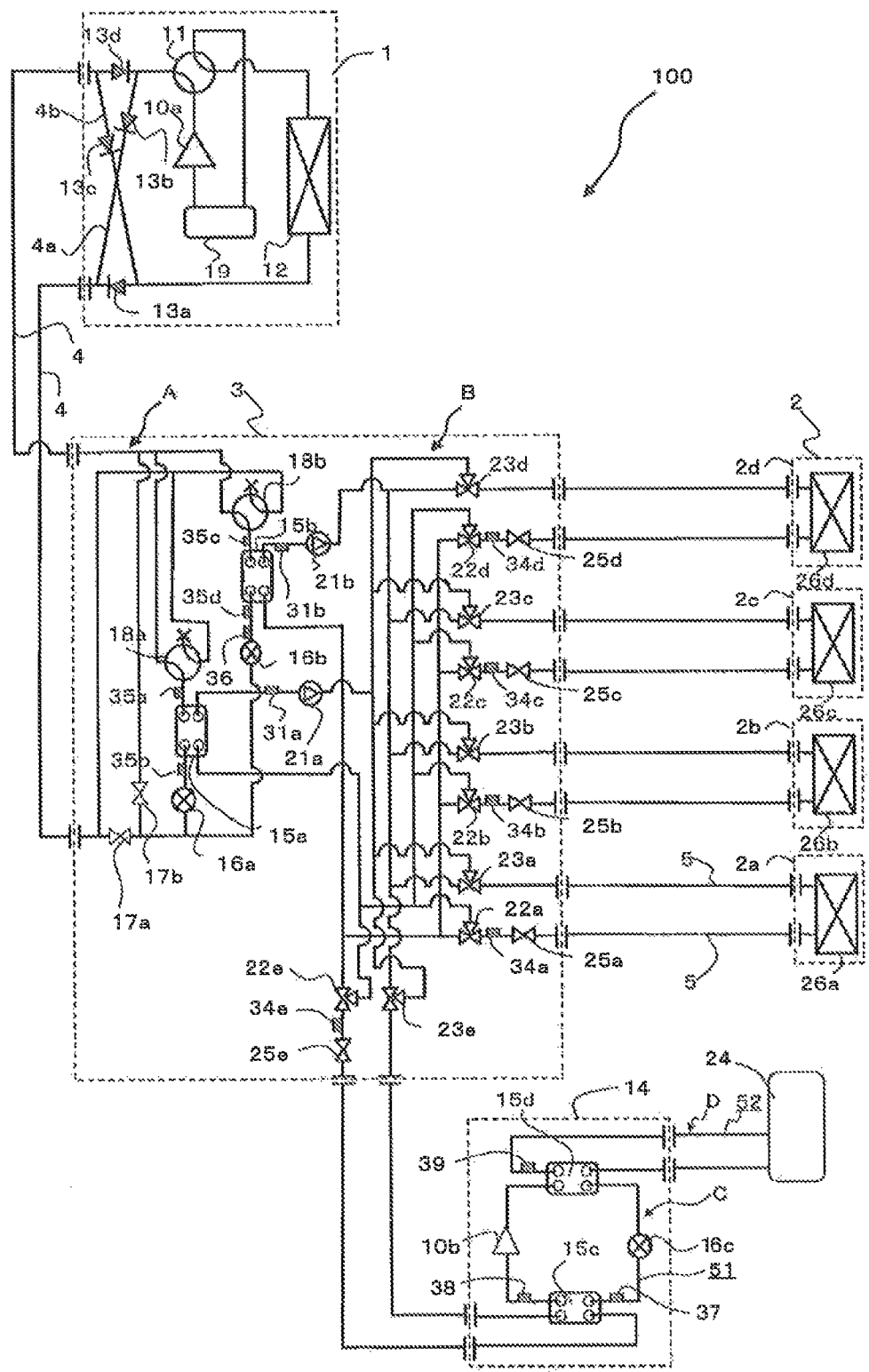
FIG. 2 is a schematic configuration diagram illustrating an example of a configuration of the air-conditioning apparatus according to Embodiment of the present invention.

FIG. 2 is a schematic configuration diagram illustrating an example of a configuration of the air-conditioning apparatus (hereinafter, referred to as an "air-conditioning apparatus 100") according to Embodiment. The detailed configuration of the air-conditioning apparatus 100 will be described with reference to FIG. 2. Referring to FIG. 2, the outdoor unit 1 is connected to the heat medium relay unit 3 by the refrigerant pipes 4 through a heat exchanger related to heat medium 15a and a heat exchanger related to heat medium 15b which are arranged in the heat medium relay unit 3. Furthermore, the heat medium relay unit 3 is connected to the indoor units 2 by the pipes 5 through the heat exchanger related to heat medium 15a and the heat exchanger related to heat medium 15b. Additionally, the heat medium relay unit 3 is connected to the hot water supply unit 14 by the pipes 5 through the heat exchanger related to heat medium 15a and the heat exchanger related to heat medium 15b. The pipes (the refrigerant pipes 4, the pipes 5, hot water supply side refrigerant pipes 51, and second heat medium pipes 52) will be described in detail later.

[Outdoor Unit 1]

The outdoor unit 1 includes a compressor 10a, a first refrigerant flow switching device 11, such as a four-way valve, a heat source side heat exchanger 12, and an accumulator 19 which are connected in series by the refrigerant pipes 4. The outdoor unit 1 further includes a first connecting pipe 4a, a second connecting pipe 4b, a check valve 13a, a check valve 13b, a check valve 13c, and a check valve 13d. Such an arrangement of the first connecting pipe 4a, the second connecting pipe 4b, the check valve 13a, the check valve 13b, the check valve 13c, and the check valve 13d enables the heat source side refrigerant, allowed to flow into the heat medium relay unit 3, to flow in a constant direction irrespective of an operation requested by any indoor unit 2.

The compressor 10a is configured to suck the heat source side refrigerant and compress the heat source side refrigerant to a high-temperature high-pressure state, and may be a capacity-controllable inverter compressor, for example. This compressor 10a functions as a first compressor that circulates the heat source side refrigerant in the refrigerant circuit A. The first refrigerant flow switching device 11 is configured to switch between a direction of flow of the heat source side refrigerant during a heating operation (including a heating only operation mode and a heating main operation mode) and a direction of flow of the heat source side refrigerant during a cooling operation (including a cooling only operation mode and a cooling main operation mode).

The heat source side heat exchanger 12 is configured to function as an evaporator in the heating operation, function as a condenser (or a radiator) in the cooling operation, exchange heat between air supplied from an air-sending device, such as a fan (not illustrated), and the heat source side refrigerant, such that the heat source side refrigerant evaporates and gasifies or condenses and liquefies. The accumulator 19 is disposed on a suction side of the compressor 10a and is configured to store excess refrigerant caused by the difference between the heating operation and the cooling operation or excess refrigerant for transient change in operation.

The check valve 13d is disposed in the refrigerant pipe 4 positioned between the heat medium relay unit 3 and the first refrigerant flow switching device 11 and is configured to permit the heat source side refrigerant to flow only in a predetermined direction (the direction from the heat medium relay unit 3 to the outdoor unit 1). The check valve 13a is disposed in the refrigerant pipe 4 positioned between the heat source side heat exchanger 12 and the heat medium relay unit 3 and is configured to permit the heat source side refrigerant to flow only in a predetermined direction (the direction from the outdoor unit 1 to the heat medium relay unit 3). The check valve 13b is disposed in the first connecting pipe 4a and is configured to allow the heat source side refrigerant, discharged from the compressor 10a in the heating operation, to flow to the heat medium relay unit 3. The check valve 13c is disposed in the second connecting pipe 4b and is configured to allow the heat source side refrigerant, returned from the heat medium relay unit 3 in the heating operation, to flow to the suction side of the compressor 10a.

The first connecting pipe 4a is configured to connect the refrigerant pipe 4, positioned between the first refrigerant flow switching device 11 and the check valve 13d, to the refrigerant pipe 4, positioned between the check valve 13a and the heat medium relay unit 3, in the outdoor unit 1. The second connecting pipe 4b is configured to connect the refrigerant pipe 4, positioned between the check valve 13d and the heat medium relay unit 3, to the refrigerant pipe 4, positioned between the heat source side heat exchanger 12 and the check valve 13a, in the outdoor unit 1. Furthermore, although FIG. 2 illustrates a case where the first connecting pipe 4a, the second connecting pipe 4b, the check valve 13a, the check valve 13b, the check valve 13c, and the check valve 13d are arranged, the arrangement is not limited to this case. It is not necessary to arrange these components.

[Indoor Units 2]

The indoor units 2 each include a use side heat exchanger 26. This use side heat exchanger 26 is connected by the pipes 5 to a heat medium flow control device 25 and a second heat medium flow switching device 23 arranged in the heat medium relay unit 3. This use side heat exchanger 26 is configured to exchange heat between air supplied from an air-sending device, such as a fan (not illustrated), and the heat medium in order to produce heating air or cooling air to be supplied to the indoor space 7.

FIG. 2 illustrates a case where four indoor units 2 are connected to the heat medium relay unit 3. An indoor unit 2a, an indoor unit 2b, an indoor unit 2c, and an indoor unit 2d are illustrated in that order from the bottom of the drawing sheet. In addition, the use side heat exchangers 26 are illustrated as a use side heat exchanger 26a, a use side heat exchanger 26b, a use side heat exchanger 26c, and a use side heat exchanger 26d in that order from the bottom of the drawing sheet so as to correspond to the indoor units 2a to 2d, respectively. Note that the number of indoor units 2 connected is not limited to four as illustrated in FIG. 2 in a manner similar to the case in FIG. 1.

[Hot Water Supply Unit 14]

The hot water supply unit 14 includes a compressor 10b, a third heat exchanger related to heat medium 15d, a second expansion device 16c, and a second heat exchanger related to heat medium 15c which are connected by the hot water supply side refrigerant pipes 51. The hot water supply unit 14 further includes a fourth temperature sensor 37 which detects a temperature of a hot water supply side refrigerant (third refrigerant) on an inlet side of the second heat exchanger related to heat medium 15c, a fifth temperature sensor 38 which detects a temperature of the hot water supply side refrigerant on an outlet side of the second heat exchanger related to heat medium 15c, and a sixth temperature sensor 39 which detects a temperature of a heat medium (second heat medium) on an outlet side of the third heat exchanger related to heat medium 15d. A second temperature sensor 34e which detects a temperature of the heat medium on the outlet side of the second heat exchanger related to heat medium 15c is installed in the heat medium relay unit 3, which will be described later.

The compressor 10b is configured to suck the hot water supply side refrigerant and compress the hot water supply side refrigerant to a high-temperature high-pressure state, and may be a capacity-controllable inverter compressor, for example. This compressor 10b functions as a second compressor that circulates the hot water supply side refrigerant in a hot water supply side refrigerant circuit C. The third heat exchanger related to heat medium 15d is configured to function as a condenser (radiator) and exchange heat between the hot water supply side refrigerant, discharged from the compressor 10b, and the second heat medium in order to transfer heating energy, stored in the hot water supply side refrigerant, to the second heat medium circulating in a hot water circuit D.

The second expansion device 16c has functions of a reducing valve and an expansion valve and is configured to reduce the pressure of the hot water supply side refrigerant in order to expand it. The second expansion device 16c is disposed between the third heat exchanger related to heat medium 15d and the second heat exchanger related to heat medium 15c. The second expansion device 16c may include a component having a variably controllable opening degree, for example, an electronic expansion valve. The second heat exchanger related to heat medium 15c is configured to function as an evaporator and exchange heat between the heat medium and the hot water supply side refrigerant in order to transfer heating energy, stored in the heat medium circulating in the heat medium circuit B, to the hot water supply side refrigerant.

Information items (temperature information items) detected by various detectors (the fourth temperature sensor 37, the fifth temperature sensor 38, and the sixth temperature sensor 39) arranged in the hot water supply unit 14 are transmitted to a controller (not illustrated) that performs centralized control of an operation of the air-conditioning apparatus 100 such that the information items are used to control, for example, a driving frequency of the compressor 10b and an opening degree of the second expansion device 16c. The controller (not illustrated) may be the same as or different from a controller which will be described in association with the heat medium relay unit 3. The second heat medium produced by the third heat exchanger related to heat medium 15d is supplied through the second heat medium pipes 52 to a hot water storage tank 24 and is stored therein such that the second heat medium can be used for hot water supply, for example.

[Heat Medium Relay Unit 3]

The heat medium relay unit 3 includes the two heat exchangers related to heat medium 15, two first expansion devices 16, two opening and closing devices 17, two second refrigerant flow switching devices 18, two pumps 21, five first heat medium flow switching devices 22, five second heat medium flow switching devices 23, and five heat medium flow control devices 25.

Each of the two heat exchangers related to heat medium 15 (the heat exchanger related to heat medium 15a and the heat exchanger related to heat medium 15b) is configured to function as a condenser (radiator) or an evaporator and exchange heat between the heat source side refrigerant and the heat medium in order to transfer cooling energy or heating energy, produced by the outdoor unit 1 and stored in the heat source side refrigerant, to the heat medium. The heat exchanger related to heat medium 15a is disposed between an expansion device 16a and a second refrigerant flow switching device 18a in the refrigerant circuit A and is used to cool the heat medium in a cooling and heating mixed operation mode. Furthermore, the heat exchanger related to heat medium 15b is disposed between an expansion device 16b and a second refrigerant flow switching device 18b in the refrigerant circuit A and is used to heat the heat medium in the cooling and heating mixed operation mode.

The two expansion devices 16 (the expansion device 16a and the expansion device 16b) each have functions of a reducing valve and an expansion valve and are configured to reduce the pressure of the heat source side refrigerant in order to expand it. The expansion device 16a is disposed upstream from the heat exchanger related to heat medium 15a in the flow direction of the heat source side refrigerant during the cooling operation. The expansion device 16b is disposed upstream from the heat exchanger related to heat medium 15b in the flow direction of the heat source side refrigerant during the cooling operation. Each of the two expansion devices 16 may include a component having a variably controllable opening degree, for example, an electronic expansion valve.

The two opening and closing devices 17 (an opening and closing device 17a and an opening and closing device 17b) each include a two-way valve and are configured to open or close the refrigerant pipe 4. The opening and closing device 17a is disposed in the refrigerant pipe 4 on an inlet side for the heat source side refrigerant. The opening and closing device 17b is disposed in a pipe connecting the refrigerant pipe 4 on the inlet side for the heat source side refrigerant and the refrigerant pipe 4 on an outlet side therefor.

The two second refrigerant flow switching devices 18 (the second refrigerant flow switching device 18a and the second refrigerant flow switching device 18b) each include a four-way valve and are configured to switch between flow directions of the heat source side refrigerant in accordance with an operation mode. The second refrigerant flow switching device 18a is disposed downstream from the heat exchanger related to heat medium 15a in the flow direction of the heat source side refrigerant during the cooling operation. The second refrigerant flow switching device 18b is disposed downstream from the heat exchanger related to heat medium 15b in the flow direction of the heat source side refrigerant in the cooling only operation mode.

The two pumps 21 (a pump 21a and a pump 21b) are configured to circulate the heat medium conveyed through the pipe 5. The pump 21a is disposed in the pipe 5 positioned between the heat exchanger related to heat medium 15a and the second heat medium flow switching devices 23. The pump 21b is disposed in the pipe 5 positioned between the heat exchanger related to heat medium 15b and the second heat medium flow switching devices 23. Each of the two pumps 21 may be, for example, a capacity-controllable pump such that a flow rate in the pump can be controlled in accordance with the magnitude of loads in the indoor units 2.

The five first heat medium flow switching devices 22 (first heat medium flow switching devices 22a to 22e) each include a three-way valve and are configured to switch between passages for the heat medium. The first heat medium flow switching devices 22 whose number (five in this case) corresponds to the number of load side units installed are arranged. The first heat medium flow switching devices 22 are arranged on outlet sides of heat medium passages of the use side heat exchangers 26 and the second heat exchanger related to heat medium 15c such that one of the three ways of each device is connected to the heat exchanger related to heat medium 15a, another one of the three ways is connected to the heat exchanger related to heat medium 15b, and the other one of the three ways is connected to the heat medium flow control device 25.

Note that the first heat medium flow switching device 22a, the first heat medium flow switching device 22b, the first heat medium flow switching device 22c, and the first heat medium flow switching device 22d are illustrated in that order from the bottom of the drawing sheet so as to correspond to the indoor units 2. Furthermore, switching between the heat medium passages includes not only complete switching from one to another but also partial switching from one to another.

The five second heat medium flow switching devices 23 (second heat medium flow switching devices 23a to 23e) each include a three-way valve and are configured to switch between passages for the heat medium. The second heat medium flow switching devices 23 whose number (five in this case) corresponds to the number of load side units installed are arranged. The second heat medium flow switching devices 23 are arranged on inlet sides of the heat medium passages of the use side heat exchangers 26 and the second heat exchanger related to heat medium 15c such that one of the three ways of each device is connected to the heat exchanger related to heat medium 15a, another one of the three ways is connected to the heat exchanger related to heat medium 15b, and the other one of the three ways is connected to the use side heat exchanger 26 or the second heat exchanger related to heat medium 15c.

Note that the second heat medium flow switching device 23a, the second heat medium flow switching device 23b, the second heat medium flow switching device 23c, and the second heat medium flow switching device 23d are illustrated in that order from the bottom of the drawing sheet so as to correspond to the indoor units 2. Furthermore, switching between the heat medium passages includes not only complete switching from one to another but also partial switching from one to another.

The five heat medium flow control devices 25 (heat medium flow control devices 25a to 25e) each include a two-way valve capable of controlling the area of an opening and are configured to control a flow rate of the heat medium flowing through the pipe 5. The heat medium flow control devices 25 whose number (five in this case) corresponds to the number of load side units installed are arranged. The heat medium flow control devices 25 are arranged on the outlet sides of the heat medium passages of the use side heat exchangers 26 and the second heat exchanger related to heat medium 15c such that one way of each device is connected to the use side heat exchanger 26 or the second heat exchanger related to heat medium 15c and the other way is connected to the first heat medium flow switching device 22. In other words, each heat medium flow control device 25 is configured to control the rate of the heat medium flowing into the load side unit in accordance with a temperature of the heat medium flowing into the load side unit and a temperature of the heat medium flowing therefrom such that an optimum rate of heat medium based on a load can be provided to the load side unit.

Note that the heat medium flow control device 25a, the heat medium flow control device 25b, the heat medium flow control device 25c, and the heat medium flow control device 25d are illustrated in that order from the bottom of the drawing sheet so as to correspond to the indoor units 2. Furthermore, each heat medium flow control device 25 may be disposed on the inlet side of the heat medium passage of the use side heat exchanger 26 or the second heat exchanger related to heat medium 15c. Furthermore, the heat medium flow control device 25 may be disposed on the inlet side of the heat medium passage of the use side heat exchanger 26 or the second heat exchanger related to heat medium 15c such that the heat medium flow control device 25 is positioned between the second heat medium flow switching device 23 and the use side heat exchanger 26 or the second heat exchanger related to heat medium 15c. Furthermore, while any load is not needed in the load side unit, for example, during suspension or thermo-off, fully closing the heat medium flow control device 25 can stop supply of the heat medium to the load side unit.

The heat medium relay unit 3 further includes various detecting means (two first temperature sensors 31, five second temperature sensors 34, four third temperature sensors 35, and a pressure sensor 36). Information items (temperature information items and pressure information) detected by these detecting means are transmitted to the controller (not illustrated) that performs centralized control of an operation of the air-conditioning apparatus 100 such that the information items are used to control, for example, a driving frequency of the compressor 10a, a rotation speed of each air-sending device (not illustrated), switching by the first refrigerant flow switching device 11, a driving frequency of the pumps 21, switching by the second refrigerant flow switching devices 18, switching between passages for the heat medium, and a flow rate of the heat medium in each load side unit.

Each of the two first temperature sensors 31 (a first temperature sensor 31a and a first temperature sensor 31b) is configured to detect a temperature of the heat medium flowing from the heat exchanger related to heat medium 15, namely, the heat medium on the outlet side of the heat exchanger related to heat medium 15 and may be a thermistor, for example. The first temperature sensor 31a is disposed in the pipe 5 on an inlet side of the pump 21a. The first temperature sensor 31b is disposed in the pipe 5 on an inlet side of the pump 21b.

Each of the five second temperature sensors 34 (second temperature sensors 34a to 34e) is disposed between the first heat medium flow switching device 22 and the heat medium flow control device 25 and is configured to detect a temperature of the heat medium flowing out of the use side heat exchanger 26 or the second heat exchanger related to heat medium 15c, and may be a thermistor, for example. The second temperature sensors 34 whose number (five in this case) corresponds to the number of load side units installed are arranged. The second temperature sensor 34a, the second temperature sensor 34b, the second temperature sensor 34c, and the second temperature sensor 34d are illustrated in that order from the bottom of the drawing sheet so as to correspond to the indoor units 2, and the second temperature sensor 34e is illustrated so as to correspond to the hot water supply unit 14. Furthermore, the second temperature sensors 34 may be arranged in passages between the heat medium flow control devices 25 and the use side heat exchangers 26.

Each of the four third temperature sensors 35 (third temperature sensors 35a to 35d) is disposed on a heat source side refrigerant inlet or outlet side of the heat exchanger related to heat medium 15 and is configured to detect a temperature of the heat source side refrigerant flowing into the heat exchanger related to heat medium 15, or a temperature of the heat source side refrigerant flowing from the heat exchanger related to heat medium 15, and may be a thermistor, for example. The third temperature sensor 35a is disposed between the heat exchanger related to heat medium 15a and the second refrigerant flow switching device 18a. The third temperature sensor 35b is disposed between the heat exchanger related to heat medium 15a and the expansion device 16a. The third temperature sensor 35c is disposed between the heat exchanger related to heat medium 15b and the second refrigerant flow switching device 18b. The third temperature sensor 35d is disposed between the heat exchanger related to heat medium 15b and the expansion device 16b.

The pressure sensor 36 is disposed between the heat exchanger related to heat medium 15b and the expansion device 16b, similar to the installation position of the third temperature sensor 35d, and is configured to detect a pressure of the heat source side refrigerant flowing between the heat exchanger related to heat medium 15b and the expansion device 16b.

Furthermore, the controller (not illustrated) includes a microcomputer and controls, for example, the driving frequency of the compressor 10a, the rotation speed (including ON/OFF) of each air-sending device, switching by the first refrigerant flow switching device 11, driving of the pumps 21, the opening degree of each expansion device 16, opening and closing of each opening and closing device 17, switching by the second refrigerant flow switching devices 18, switching by the first heat medium flow switching devices 22, switching by the second heat medium flow switching devices 23, and driving of the heat medium flow control devices 25 on the basis of the information items detected by the various detecting means and an instruction from a remote control to carry out any of the operation modes which will be described later. Note that the controller (including a first controller and a second controller) may be provided for each unit or may be provided for the outdoor unit 1 or the heat medium relay unit 3. In the case where the controller is provided for each unit, the controllers may be connected such that they can communicate with each other by wire or wireless to enable control in cooperation with one another.

The pipes 5 for conveying the heat medium include the pipes connected to the heat exchanger related to heat medium 15a and the pipes connected to the heat exchanger related to heat medium 15b. Each pipe 5 branches (into five pipes in this case) in accordance with the number of indoor units 2 connected to the heat medium relay unit 3. The pipes 5 are connected via the first heat medium flow switching devices 22 and the second heat medium flow switching devices 23. Controlling each first heat medium flow switching device 22 and each second heat medium flow switching device 23 determines whether the heat medium flowing from the heat exchanger related to heat medium 15a is allowed to flow into the corresponding use side heat exchanger 26 or the second heat exchanger related to heat medium 15c and whether the heat medium flowing from the heat exchanger related to heat medium 15b is allowed to flow into the corresponding use side heat exchanger 26 or the second heat exchanger related to heat medium 15c.

In the air-conditioning apparatus 100, the compressor 10a, the first refrigerant flow switching device 11, the heat source side heat exchanger 12, the opening and closing devices 17, the second refrigerant flow switching devices 18, refrigerant passages of the heat exchangers related to heat medium 15, the expansion devices 16, and the accumulator 19 are connected by the refrigerant pipes 4, thus forming the refrigerant circuit A, serving as a first refrigerant circuit. In addition, heat medium passages of the heat exchangers related to heat medium 15, the pumps 21, the first heat medium flow switching devices 22, the heat medium flow control devices 25, the use side heat exchangers 26, the heat medium passage of the second heat exchanger related to heat medium 15c, and the second heat medium flow switching devices 23 are connected by the pipes 5, thus forming the heat medium circuits B, serving as first heat medium circuits. In other words, each of the plurality of use side heat exchangers 26 and the second heat exchanger related to heat medium 15c is connected in parallel to each of the heat exchangers related to heat medium 15, thus providing a plurality of heat medium circuits B.

Accordingly, in the air-conditioning apparatus 100, the outdoor unit 1 and the heat medium relay unit 3 are connected through the heat exchanger related to heat medium 15a and the heat exchanger related to heat medium 15b arranged in the heat medium relay unit 3. The heat medium relay unit 3 and each indoor unit 2 are also connected through the heat exchanger related to heat medium 15a and the heat exchanger related to heat medium 15b. The heat medium relay unit 3 and the hot water supply unit 14 are also connected through the heat exchanger related to heat medium 15a and the heat exchanger related to heat medium 15b. In other words, in the air-conditioning apparatus 100, the heat exchanger related to heat medium 15a and the heat exchanger related to heat medium 15b each exchange heat between the heat source side refrigerant circulating in the refrigerant circuit A and the heat medium circulating in the heat medium circuits B.

Furthermore, in the air-conditioning apparatus 100, the compressor 10b, a hot water supply side refrigerant passage of the third heat exchanger related to heat medium 15d, the second expansion device 16c, and a hot water supply side refrigerant passage of the second heat exchanger related to heat medium 15c are connected by the hot water supply side refrigerant pipes 51, thus forming the hot water supply side refrigerant circuit C, serving as a second refrigerant circuit. In addition, a second heat medium passage of the third heat exchanger related to heat medium 15d and the hot water storage tank 24 are connected by the second heat medium pipes 52, thus forming the hot water circuit D, serving as a second heat medium circuit. In the air-conditioning apparatus 100, therefore, the heat medium relay unit 3 and the hot water supply unit 14 are connected not only through the heat exchanger related to heat medium 15a and the heat exchanger related to heat medium 15b arranged in the heat medium relay unit 3 but also through the second heat exchanger related to heat medium 15c disposed in the hot water supply unit 14.

The operation modes carried out by the air-conditioning apparatus 100 will be described. The air-conditioning apparatus 100 enables each indoor unit 2, on the basis of an instruction from the indoor unit 2, to perform a cooling operation or heating operation. Specifically, the air-conditioning apparatus 100 enables all of the indoor units 2 to perform the same operation and also enables the indoor units 2 to perform different operations. Furthermore, the air-conditioning apparatus 100 enables the hot water supply unit 14 to perform a hot water supply operation (which will be described in detail later).

The operation modes carried out by the air-conditioning apparatus 100 include the cooling only operation mode in which all of the operating indoor units 2 perform the cooling operation, the heating only operation mode in which all of the operating indoor units 2 perform the heating operation, the cooling main operation mode which is a cooling and heating mixed operation mode in which a cooling load is larger than a heating load, and the heating main operation mode which is a cooling and heating mixed operation mode in which a heating load is larger than a cooling load. The operation modes will be described below with respect to the flow of the heat source side refrigerant and that of the heat medium.

[Cooling Only Operation Mode]

Figure 3:
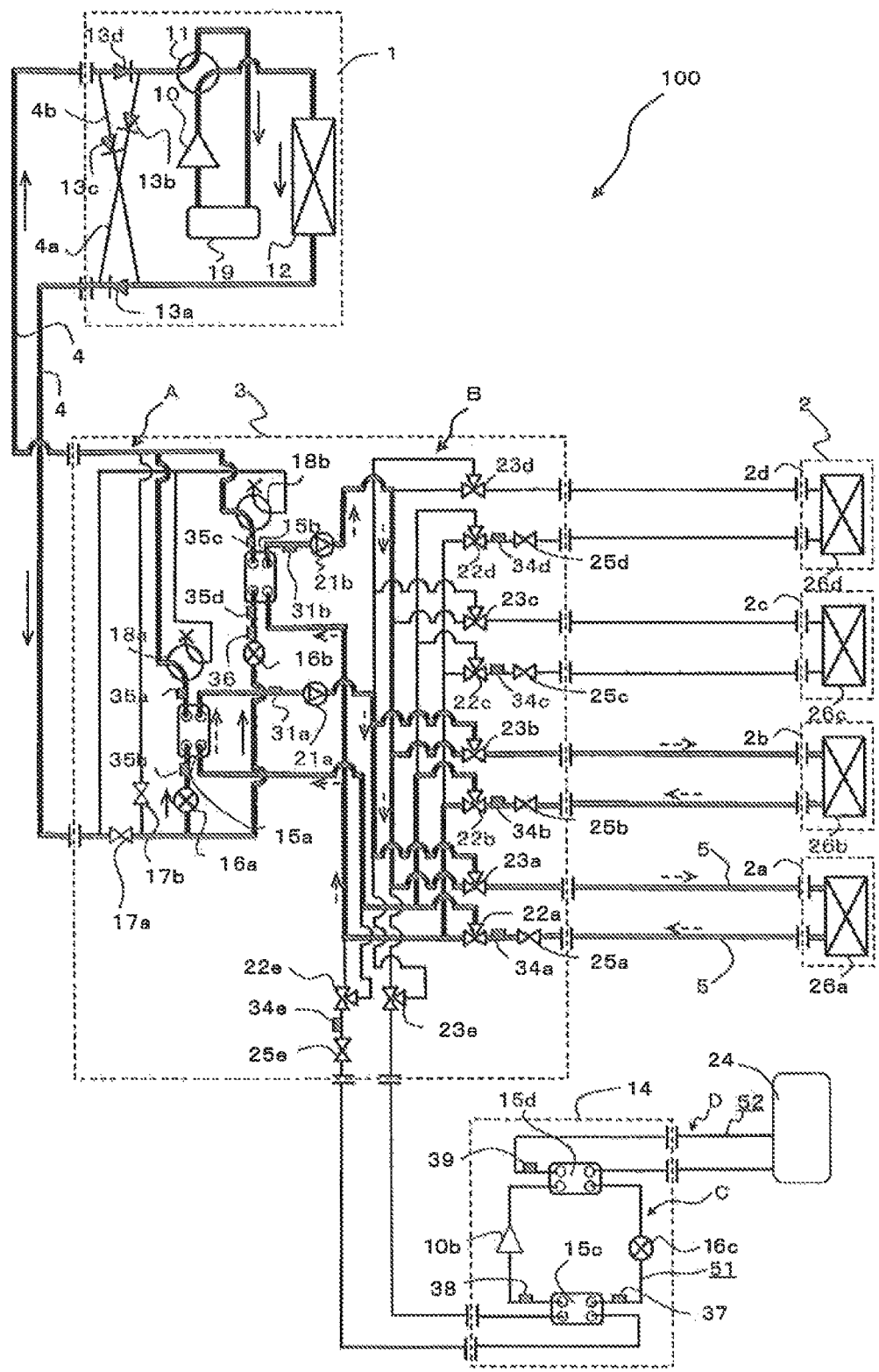
FIG. 3 is a refrigerant circuit diagram illustrating flows of refrigerants in a cooling only operation mode of the air-conditioning apparatus according to Embodiment of the present invention.

FIG. 3 is a refrigerant circuit diagram illustrating the flows of refrigerants in the cooling only operation mode of the air-conditioning apparatus 100. The cooling only operation mode will be described with respect to a case where a cooling load is generated only in the use side heat exchanger 26a and the use side heat exchanger 26b in FIG. 3. In FIG. 3, pipes indicated by thick lines correspond to pipes through which the refrigerants (the heat source side refrigerant and the heat medium) flow. Furthermore, in FIG. 3, solid-line arrows indicate a flow direction of the heat source side refrigerant and broken-line arrows indicate a flow direction of the heat medium.

In the cooling only operation mode illustrated in FIG. 3, in the outdoor unit 1, the first refrigerant flow switching device 11 is allowed to perform switching such that the heat source side refrigerant discharged from the compressor 10a flows into the heat source side heat exchanger 12. In the heat medium relay unit 3, the pump 21a and the pump 21b are driven, the heat medium flow control device 25a and the heat medium flow control device 25b are opened, and the heat medium flow control device 25c, the heat medium flow control device 25d, and the heat medium flow control device 25e are fully closed such that the heat medium circulates between the heat exchanger related to heat medium 15a and the use side heat exchanger 26a and 26b and also circulates between the heat exchanger related to heat medium 15b and the use side heat exchangers 26a and 26b. In other words, the hot water supply unit 14 is suspended in the cooling only operation mode.

First, the flow of the heat source side refrigerant in the refrigerant circuit A will be described.

A low-temperature low-pressure refrigerant is compressed by the compressor 10a and is discharged as a high-temperature high-pressure gas refrigerant therefrom. The high-temperature high-pressure gas refrigerant discharged from the compressor 10a flows through the first refrigerant flow switching device 11 into the heat source side heat exchanger 12. Then, the refrigerant condenses and liquefies while transferring heat to outdoor air in the heat source side heat exchanger 12, such that it turns into a high-pressure liquid refrigerant. The high-pressure liquid refrigerant flowing out of the heat source side heat exchanger 12 passes through the check valve 13a, flows out of the outdoor unit 1, passes through the refrigerant pipe 4, and flows into the heat medium relay unit 3. The high-pressure liquid refrigerant, which has flowed into the heat medium relay unit 3, passes through the opening and closing device 17a and is then divided into flows to the expansion device 16a and the expansion device 16b, in each of which the refrigerant is expanded into a low-temperature low-pressure two-phase refrigerant.

These flows of two-phase refrigerant enter the heat exchanger related to heat medium 15a and the heat exchanger related to heat medium 15b, functioning as evaporators, in each of which the refrigerant removes heat from the heat medium circulating in the heat medium circuits B to cool the heat medium, and thus turns into a low-temperature low-pressure gas refrigerant. The gas refrigerant, which has flowed from the heat exchanger related to heat medium 15a and the heat exchanger related to heat medium 15b, flows out of the heat medium relay unit 3 after passing through the second refrigerant flow switching device 18a and the second refrigerant flow switching device 18b, passes through the refrigerant pipe 4, and again flows into the outdoor unit 1. The refrigerant, which has flowed into the outdoor unit 1, passes through the check valve 13d, the first refrigerant flow switching device 11, and the accumulator 19, and is then again sucked into the compressor 10a.

At this time, the opening degree of the expansion device 16a is controlled such that superheat (the degree of superheat) is constant, the superheat being obtained as the difference between a temperature detected by the third temperature sensor 35a and that detected by the third temperature sensor 35b. Similarly, the opening degree of the expansion device 16b is controlled such that superheat is constant, the superheat being obtained as the difference between a temperature detected by the third temperature sensor 35c and that detected by the third temperature sensor 35d. The opening and closing device 17a is opened and the opening and closing device 17b is closed.

Next, the flow of the heat medium in the heat medium circuits B will be described.

In the cooling only operation mode, both the heat exchanger related to heat medium 15a and the heat exchanger related to heat medium 15b transfer cooling energy of the heat source side refrigerant to the heat medium and the pump 21a and the pump 21b allow the cooled heat medium to flow through the pipes 5. The heat medium, which has flowed out of each of the pump 21a and the pump 21b while being pressurized, flows through the second heat medium flow switching device 23a and the second heat medium flow switching device 23b into the use side heat exchanger 26a and the use side heat exchanger 26b. The heat medium removes heat from the indoor air through each of the use side heat exchanger 26a and the use side heat exchanger 26b, thus cooling the indoor space 7.

Then, the heat medium flows out of each of the use side heat exchanger 26a and the use side heat exchanger 26b and flows into the corresponding one of the heat medium flow control device 25a and the heat medium flow control device 25b. At this time, each of the heat medium flow control device 25a and the heat medium flow control device 25b allows the heat medium to be controlled at a flow rate necessary to cover an air conditioning load required in the indoor space, such that the controlled flow rate of heat medium flows into the corresponding one of the use side heat exchanger 26a and the use side heat exchanger 26b. The heat medium, which has flowed out of the heat medium flow control device 25a and the heat medium flow control device 25b, passes through the first heat medium flow switching device 22a and the first heat medium flow switching device 22b, flows into the heat exchanger related to heat medium 15a and the heat exchanger related to heat medium 15b, and is then again sucked into the pump 21a and the pump 21b.

Note that in the pipe 5 in each use side heat exchanger 26, the heat medium flows in a direction in which it flows from the second heat medium flow switching device 23 through the heat medium flow control device 25 to the first heat medium flow switching device 22. Furthermore, the difference between a temperature detected by the first temperature sensor 31a or that detected by the first temperature sensor 31b and a temperature detected by the second temperature sensor 34 is controlled such that the difference is held at a target value, so that the air conditioning load required in the indoor space 7 can be covered. As regards a temperature on the outlet side of the heat exchangers related to heat medium 15, either of the temperature detected by the first temperature sensor 31a and that detected by the first temperature sensor 31b may be used. Alternatively, the mean temperature of them may be used. At this time, the first heat medium flow switching devices 22 and the second heat medium flow switching devices 23 are controlled at a medium opening degree such that passages to both the heat exchanger related to heat medium 15a and the heat exchanger related to heat medium 15b are established.

Upon carrying out the cooling only operation mode, since it is unnecessary to supply the heat medium to each use side heat exchanger 26 having no thermal load (including thermo-off) and the second heat exchanger related to heat medium 15c, the passages are closed by the corresponding heat medium flow control devices 25 such that the heat medium does not flow into the use side heat exchanger 26 and the second heat exchanger related to heat medium 15c. In FIG. 3, the heat medium flows into the use side heat exchanger 26a and the use side heat exchanger 26b because these use side heat exchangers each have a thermal load. The use side heat exchanger 26c, the use side heat exchanger 26d, and the second heat exchanger related to heat medium 15c have no thermal load and the corresponding heat medium flow control devices 25c, 25d, and 25e are fully closed. When a thermal load is generated in the use side heat exchanger 26c, the use side heat exchanger 26d, or the second heat exchanger related to heat medium 15c, the heat medium flow control device 25c, the heat medium flow control device 25d, or the heat medium flow control device 25e may be opened such that the heat medium is circulated.

[Heating Only Operation Mode]

Figure 4:
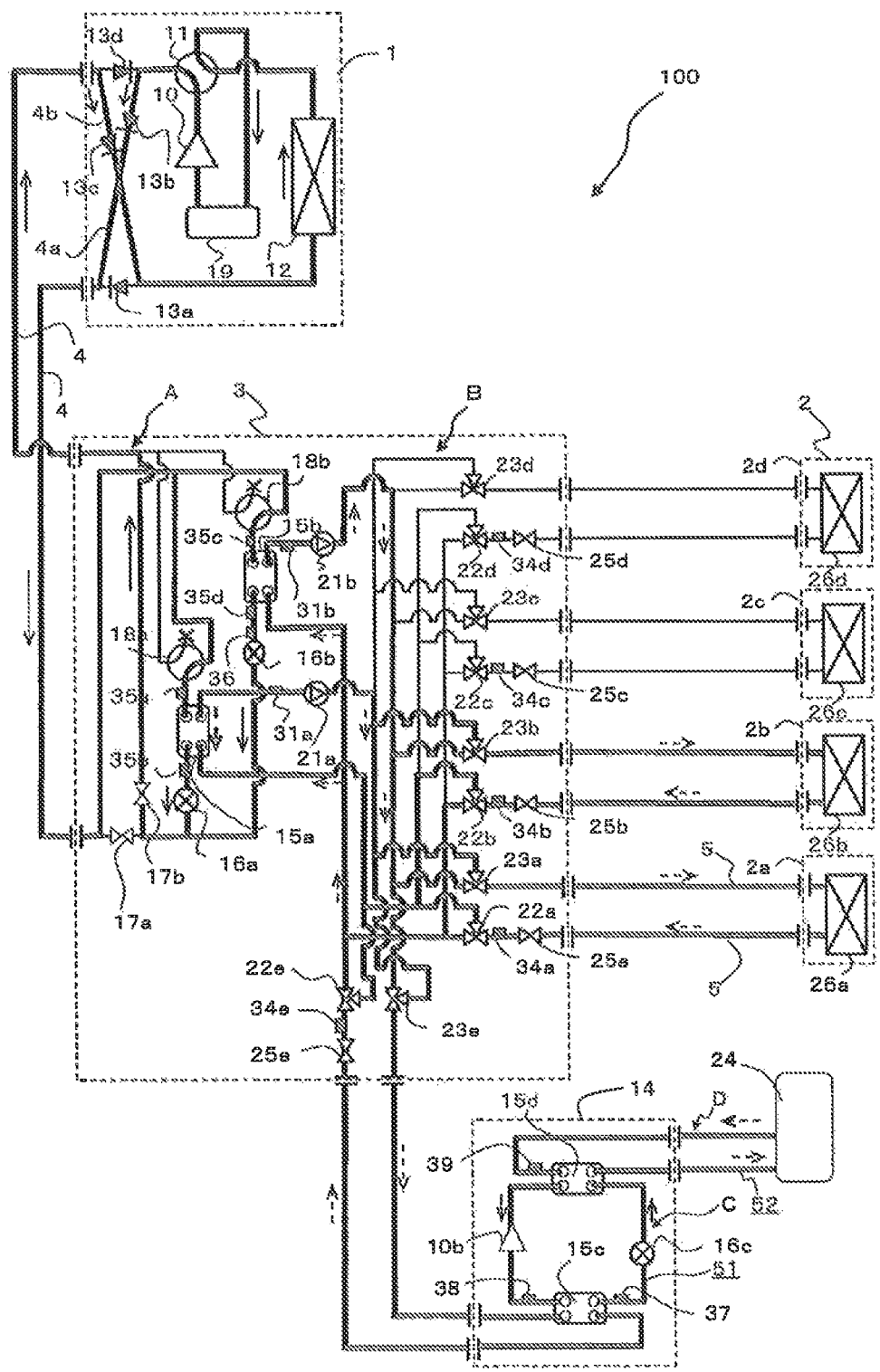
FIG. 4 is a refrigerant circuit diagram illustrating the flows of the refrigerants in a heating only operation mode of the air-conditioning apparatus according to Embodiment of the present invention.

FIG. 4 is a refrigerant circuit diagram illustrating the flows of the refrigerants in the heating only operation mode of the air-conditioning apparatus 100. The heating only operation mode will be described with respect to a case where a heating load is generated only in the use side heat exchanger 26a and the use side heat exchanger 26b in FIG. 4. In FIG. 4, pipes indicated by thick lines correspond to pipes through which the refrigerants (the heat source side refrigerant and the heat medium) flow. Furthermore, in FIG. 4, solid-line arrows indicate a flow direction of the heat source side refrigerant and broken-line arrows indicate a flow direction of the heat medium. Furthermore, the hot water supply unit 14 is activated in the heating only operation mode.

In the heating only operation mode illustrated in FIG. 4, in the outdoor unit 1, the first refrigerant flow switching device 11 is allowed to perform switching such that the heat source side refrigerant discharged from the compressor 10a flows into the heat medium relay unit 3 without passing through the heat source side heat exchanger 12. In the heat medium relay unit 3, the pump 21a and the pump 21b are driven, the heat medium flow control device 25a, the heat medium flow control device 25b, and the heat medium flow control device 25e are opened, and the heat medium flow control device 25c and the heat medium flow control device 25d are fully closed such that the heat medium circulates between the heat exchanger related to heat medium 15a and each of the use side heat exchangers 26a and 26b and the second heat exchanger related to heat medium 15c and also circulates between the heat exchanger related to heat medium 15b and each of the use side heat exchangers 26a and 26b and the second heat exchanger related to heat medium 15c.

First, the flow of the heat source side refrigerant in the refrigerant circuit A will be described.

A low-temperature low-pressure refrigerant is compressed by the compressor 10a and is discharged as a high-temperature high-pressure gas refrigerant therefrom. The high-temperature high-pressure gas refrigerant discharged from the compressor 10a passes through the first refrigerant flow switching device 11, flows through the first connecting pipe 4a, passes through the check valve 13b, and flows out of the outdoor unit 1. The high-temperature high-pressure gas refrigerant, which has flowed out of the outdoor unit 1, passes through the refrigerant pipe 4 and flows into the heat medium relay unit 3. The high-temperature high-pressure gas refrigerant, which has flowed into the heat medium relay unit 3, is divided into flows such that the flows pass through the second refrigerant flow switching device 18a and the second refrigerant flow switching device 18b and then enter the heat exchanger related to heat medium 15a and the heat exchanger related to heat medium 15b.

The high-temperature high-pressure gas refrigerant, which has flowed into the heat exchanger related to heat medium 15a and the heat exchanger related to heat medium 15b, condenses and liquefies while transferring heat to the heat medium circulating in the heat medium circuits B, such that it turns into a high-pressure liquid refrigerant. The liquid refrigerant flowing from the heat exchanger related to heat medium 15a and that flowing from the heat exchanger related to heat medium 15b are expanded into a low-temperature low-pressure two-phase refrigerant by the expansion device 16a and the expansion device 16b. This two-phase refrigerant passes through the opening and closing device 17b, flows out of the heat medium relay unit 3, passes through the refrigerant pipe 4, and again flows into the outdoor unit 1. The refrigerant, which has flowed into the outdoor unit 1, flows through the second connecting pipe 4b, passes through the check valve 13c, and flows into the heat source side heat exchanger 12, functioning as an evaporator.

The heat source side refrigerant, which has flowed into the heat source side heat exchanger 12, removes heat from the outdoor air in the heat source side heat exchanger 12, such that it turns into a low-temperature low-pressure gas refrigerant. The low-temperature low-pressure gas refrigerant, which has flowed out of the heat source side heat exchanger 12, passes through the first refrigerant flow switching device 11 and the accumulator 19 and is again sucked into the compressor 10a.

At this time, the opening degree of the expansion device 16a is controlled such that subcooling (the degree of subcooling) is constant, the subcooling being obtained as the difference between a saturation temperature converted from a pressure detected by the pressure sensor 36 and a temperature detected by the third temperature sensor 35b. Similarly, the opening degree of the expansion device 16b is controlled such that subcooling is constant, the subcooling being obtained as the difference between the saturation temperature converted from the pressure detected by the pressure sensor 36 and a temperature detected by the third temperature sensor 35d. The opening and closing device 17a is closed and the opening and closing device 17b is opened. Note that in the case where a temperature at the middle position of each heat exchanger related to heat medium 15 can be measured, the temperature at the middle position may be used instead of the pressure sensor 36. Thus, such a system can be constructed inexpensively.

Next, the flow of the heat medium in the heat medium circuits B will be described.

In the heating only operation mode, both the heat exchanger related to heat medium 15a and the heat exchanger related to heat medium 15b transfer heating energy of the heat source side refrigerant to the heat medium and the pump 21a and the pump 21b allow the heated heat medium to flow through the pipes 5. The heat medium, which has flowed out of each of the pump 21a and the pump 21b while being pressurized, flows through the second heat medium flow switching device 23a, the second heat medium flow switching device 23b, and the second heat medium flow switching device 23e into the use side heat exchanger 26a, the use side heat exchanger 26b, and the second heat exchanger related to heat medium 15c. The heat medium transfers heat to the indoor air through each of the use side heat exchanger 26a and the use side heat exchanger 26b, thus heating the indoor space 7. Additionally, the heat medium transfers heat to the second heat medium, such as water, circulating in the hot water circuit D through the second heat exchanger related to heat medium 15c and the third heat exchanger related to heat medium 15d, thus producing hot water to be stored in the hot water storage tank 24.

Then, the heat medium flows out of each of the use side heat exchanger 26a, the use side heat exchanger 26b, and the second heat exchanger related to heat medium 15b, and flows into the corresponding one of the heat medium flow control device 25a, the heat medium flow control device 25b, and the heat medium flow control device 25e. At this time, each of the heat medium flow control device 25a, the heat medium flow control device 25b, and the heat medium flow control device 25e allows the heat medium to be controlled at a flow rate necessary to cover an air conditioning load required in the indoor space or the hot water supply unit 14, such that the controlled flow rate of heat medium flows into the corresponding one of the use side heat exchanger 26a, the use side heat exchanger 26b, and the second heat exchanger related to heat medium 15c. The heat medium, which has flowed out of the heat medium flow control device 25a, the heat medium flow control device 25b, and the heat medium flow control device 25e, passes through the first heat medium flow switching device 22a, the first heat medium flow switching device 22b, and the first heat medium flow switching device 22e, flows into the heat exchanger related to heat medium 15a and the heat exchanger related to heat medium 15b, and is then again sucked into the pump 21a and the pump 21b.

Note that in the pipe 5 in each use side heat exchanger 26, the heat medium flows in a direction in which it flows from the second heat medium flow switching device 23 through the heat medium flow control device 25 to the first heat medium flow switching device 22. Furthermore, the difference between a temperature detected by the first temperature sensor 31a or that detected by the first temperature sensor 31b and a temperature detected by the second temperature sensor 34 is controlled such that the difference is held at a target value, so that the air conditioning load required in the indoor space 7 can be covered. As regards a temperature on the outlet side of the heat exchangers related to heat medium 15, either of the temperature detected by the first temperature sensor 31a and that detected by the first temperature sensor 31b may be used. Alternatively, the mean temperature of them may be used.

At this time, the first heat medium flow switching devices 22 and the second heat medium flow switching devices 23 are controlled at a medium opening degree such that passages to both the heat exchanger related to heat medium 15a and the heat exchanger related to heat medium 15b are established. Although the use side heat exchanger 26a should essentially be controlled on the basis of the difference between a temperature at the inlet and that at the outlet, since a temperature of the heat medium on the inlet side of the use side heat exchanger 26 is substantially the same as a temperature detected by the first temperature sensor 31b, the use of the first temperature sensor 31b can reduce the number of temperature sensors, so that the system can be constructed inexpensively.

Upon carrying out the heating only operation mode, since it is unnecessary to supply the heat medium to each use side heat exchanger 26 having no thermal load (including thermo-off), the passage is closed by the corresponding heat medium flow control device 25 such that the heat medium does not flow into the use side heat exchanger 26. In FIG. 4, the heat medium flows into the use side heat exchanger 26a, the use side heat exchanger 26b, and the second heat exchanger related to heat medium 15c because these heat exchangers each have a thermal load. The use side heat exchanger 26c and the use side heat exchanger 26d have no thermal load and the corresponding heat medium flow control devices 25c and 25d are fully closed. When a thermal load is generated in the use side heat exchanger 26c or the use side heat exchanger 26d, the heat medium flow control device 25c or the heat medium flow control device 25d may be opened such that the heat medium is circulated.

[Cooling Main Operation Mode]

Figure 5:
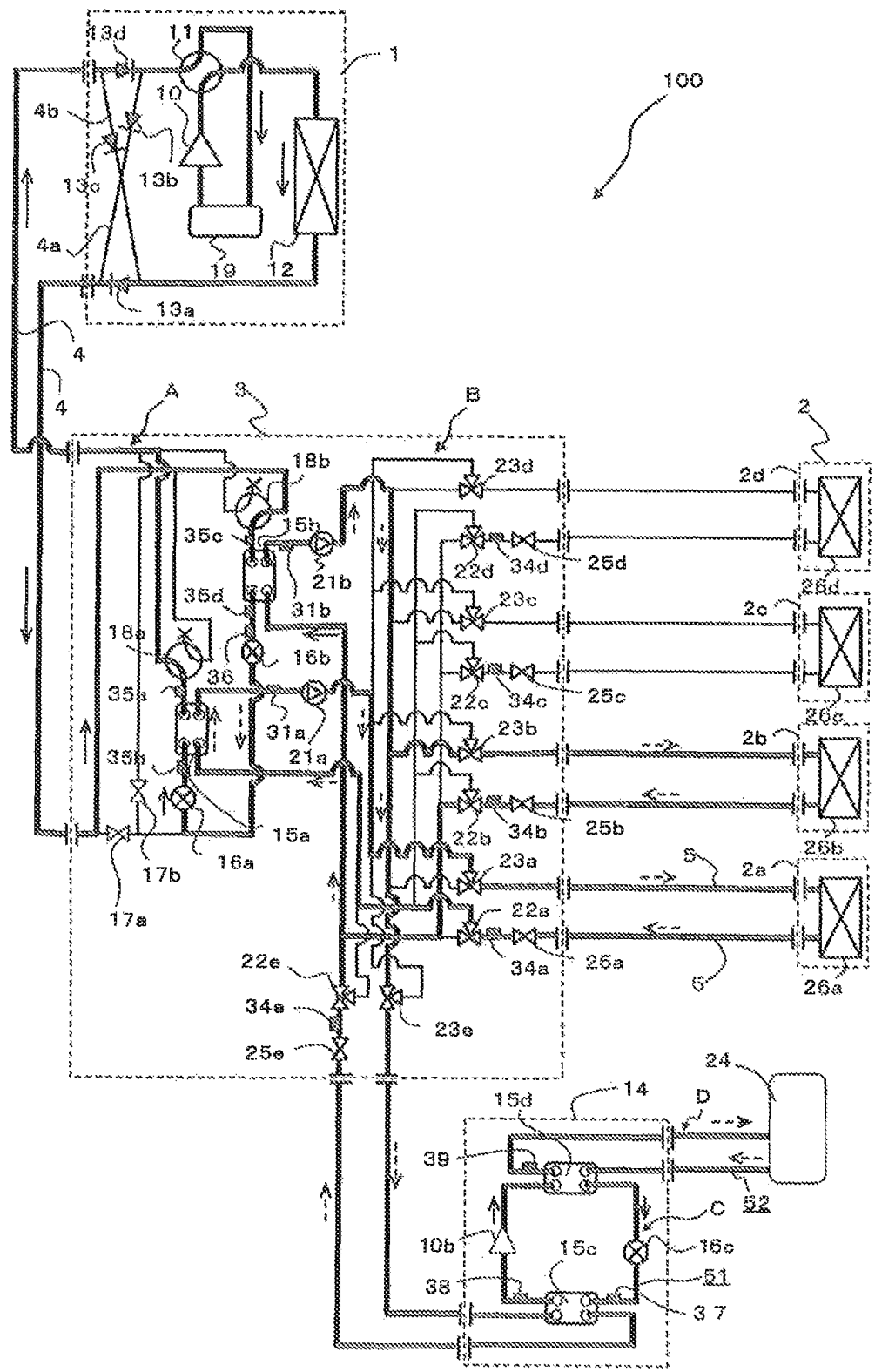
FIG. 5 is a refrigerant circuit diagram illustrating the flows of the refrigerants in a cooling main operation mode of the air-conditioning apparatus according to Embodiment of the present invention.

FIG. 5 is a refrigerant circuit diagram illustrating the flows of the refrigerants in the cooling main operation mode of the air-conditioning apparatus 100. The cooling main operation mode will be described with respect to a case where a cooling load is generated in the use side heat exchanger 26a and a heating load is generated in the use side heat exchanger 26b in FIG. 5. In FIG. 5, pipes indicated by thick lines correspond to pipes through which the refrigerants (the heat source side refrigerant and the heat medium) circulate. Furthermore, in FIG. 5, solid-line arrows indicate a flow direction of the heat source side refrigerant and broken-line arrows indicate a flow direction of the heat medium. Additionally, the hot water supply unit 14 is activated in the cooling main operation mode.

In the cooling main operation mode illustrated in FIG. 5, in the outdoor unit 1, the first refrigerant flow switching device 11 is allowed to perform switching such that the heat source side refrigerant discharged from the compressor 10a flows into the heat source side heat exchanger 12. In the heat medium relay unit 3, the pump 21a and the pump 21b are driven, the heat medium flow control device 25a, the heat medium flow control device 25b, and the heat medium flow control device 25e are opened, and the heat medium flow control device 25c and the heat medium flow control device 25d are fully closed such that the heat medium circulates between the heat exchanger related to heat medium 15a and the use side heat exchanger 26a, the heat medium circulates between the heat exchanger related to heat medium 15b and the use side heat exchanger 26b, and the heat medium circulates between the heat exchanger related to heat medium 15b and the second heat exchanger related to heat medium 15c.

First, the flow of the heat source side refrigerant in the refrigerant circuit A will be described.

A low-temperature low-pressure refrigerant is compressed by the compressor 10a and is discharged as a high-temperature high-pressure gas refrigerant therefrom. The high-temperature high-pressure gas refrigerant discharged from the compressor 10a flows through the first refrigerant flow switching device 11 into the heat source side heat exchanger 12. The refrigerant condenses into a two-phase refrigerant in the heat source side heat exchanger 12 while transferring heat to the outside air. The two-phase refrigerant, which has flowed out of the heat source side heat exchanger 12, passes through the check valve 13a, flows out of the outdoor unit 1, passes through the refrigerant pipe 4, and flows into the heat medium relay unit 3. The two-phase refrigerant, which has flowed into the heat medium relay unit 3, passes through the second refrigerant flow switching device 18b and flows into the heat exchanger related to heat medium 15b, functioning as a condenser.

The two-phase refrigerant, which has flowed into the heat exchanger related to heat medium 15b, condenses and liquefies while transferring heat to the heat medium circulating in the heat medium circuits B, such that it turns into a liquid refrigerant. The liquid refrigerant, which has flowed from the heat exchanger related to heat medium 15b, is expanded into a low-pressure two-phase refrigerant by the expansion device 16b. This low-pressure two-phase refrigerant flows through the expansion device 16a into the heat exchanger related to heat medium 15a, functioning as an evaporator. The low-pressure two-phase refrigerant, which has flowed into the heat exchanger related to heat medium 15a, removes heat from the heat medium circulating in the heat medium circuit B to cool the heat medium, and thus turns into a low-pressure gas refrigerant. The gas refrigerant, which has flowed from the heat exchanger related to heat medium 15a, flows through the second refrigerant flow switching device 18a out of the heat medium relay unit 3, passes through the refrigerant pipe 4, and again flows into the outdoor unit 1. The heat source side refrigerant, which has flowed into the outdoor unit 1, passes through the check valve 13d, the first refrigerant flow switching device 11, and the accumulator 19, and is then again sucked into the compressor 10a.

At this time, the opening degree of the expansion device 16b is controlled such that superheat is constant, the superheat being obtained as the difference between a temperature detected by the third temperature sensor 35a and that detected by the third temperature sensor 35b. The expansion device 16a is fully opened, the opening and closing device 17a is closed, and the opening and closing device 17b is closed. Note that the opening degree of the expansion device 16b may be controlled such that subcooling is constant, the subcooling being obtained as the difference between a saturation temperature converted from a pressure detected by the pressure sensor 36 and a temperature detected by the third temperature sensor 35d. Alternatively, the expansion device 16b may be fully opened and the expansion device 16a may control the superheat or the subcooling.

Next, the flow of the heat medium in the heat medium circuits B will be described. In the cooling main operation mode, the heat exchanger related to heat medium 15b transfers heating energy of the heat source side refrigerant to the heat medium and the pump 21b allows the heated heat medium to flow through the pipes 5. Furthermore, in the cooling main operation mode, the heat exchanger related to heat medium 15a transfers cooling energy of the heat source side refrigerant to the heat medium and the pump 21a allows the cooled heat medium to flow through the pipes 5. The heat medium, which has flowed out of each of the pump 21a and the pump 21b while being pressurized, flows through the second heat medium flow switching device 23a, the second heat medium flow switching device 23b, or the second heat medium flow switching device 23e into the use side heat exchanger 26a, the use side heat exchanger 26b, or the second heat exchanger related to heat medium 15c.

In the use side heat exchanger 26b, the heat medium transfers heat to the indoor air, thus heating the indoor space 7. In addition, in the use side heat exchanger 26a, the heat medium removes heat from the indoor air, thus cooling the indoor space 7. Furthermore, in the second heat exchanger related to heat medium 15c, the heat medium transfers heat to the hot water supply side refrigerant circulating in the hot water supply side refrigerant circuit C to produce hot water to be stored in the hot water storage tank 24. At this time, each of the heat medium flow control device 25a, the heat medium flow control device 25b, and the heat medium flow control device 25e allows the heat medium to be controlled at a flow rate necessary to cover a load required in the indoor space or the hot water supply unit 14, such that the controlled flow rate of heat medium flows into the use side heat exchanger 26a, the use side heat exchanger 26b, or the second heat exchanger related to heat medium 15c.

The heat medium, which has passed through the use side heat exchanger 26b with a slight decrease of temperature, passes through the heat medium flow control device 25b and the first heat medium flow switching device 22b. The heat medium, which has passed through the second heat exchanger related to heat medium 15c with a slight decrease of temperature, passes through the heat medium flow control device 25e and the first heat medium flow switching device 22e. These flows of heat medium merge together. The resultant heat medium flows into the heat exchanger related to heat medium 15b and is then again sucked into the pump 21b. The heat medium, which has passed through the use side heat exchanger 26a with a slight increase of temperature, passes through the heat medium flow control device 25a and the first heat medium flow switching device 22a, flows into the heat exchanger related to heat medium 15a, and is then again sucked into the pump 21a.

During this time, the first heat medium flow switching devices 22 and the second heat medium flow switching devices 23 allow the warm heat medium and the cold heat medium to be introduced into the use side heat exchanger 26 having a heating load and the use side heat exchanger 26 having a cooling load, respectively, without mixing with each other. Note that in the pipe 5 in each of the use side heat exchanger 26 for heating and that for cooling, the heat medium flows in a direction in which it flows from the second heat medium flow switching device 23 through the heat medium flow control device 25 to the first heat medium flow switching device 22. Furthermore, the difference between a temperature detected by the first temperature sensor 31b and that detected by the second temperature sensor 34 is controlled such that the difference is held at a target value, so that an air conditioning load required in the indoor space 7 to be heated can be covered. The difference between a temperature detected by the second temperature sensor 34 and that detected by the first temperature sensor 31a is controlled such that the difference is held at a target value, so that an air conditioning load required in the indoor space 7 to be cooled can be covered.

Upon carrying out the cooling main operation mode, since it is unnecessary to supply the heat medium to each use side heat exchanger 26 having no thermal load (including thermo-off), the passage is closed by the corresponding heat medium flow control device 25 such that the heat medium does not flow into the use side heat exchanger 26. In FIG. 5, the heat medium flows into the use side heat exchanger 26a, the use side heat exchanger 26b, and the second heat exchanger related to heat medium 15c because these heat exchangers each have a thermal load. The use side heat exchanger 26c and the use side heat exchanger 26d have no thermal load and the corresponding heat medium flow control devices 25c and 25d are fully closed. When a thermal load is generated in the use side heat exchanger 26c or the use side heat exchanger 26d, the heat medium flow control device 25c or the heat medium flow control device 25d may be opened such that the heat medium is circulated.

[Heating Main Operation Mode]

Figure 6:
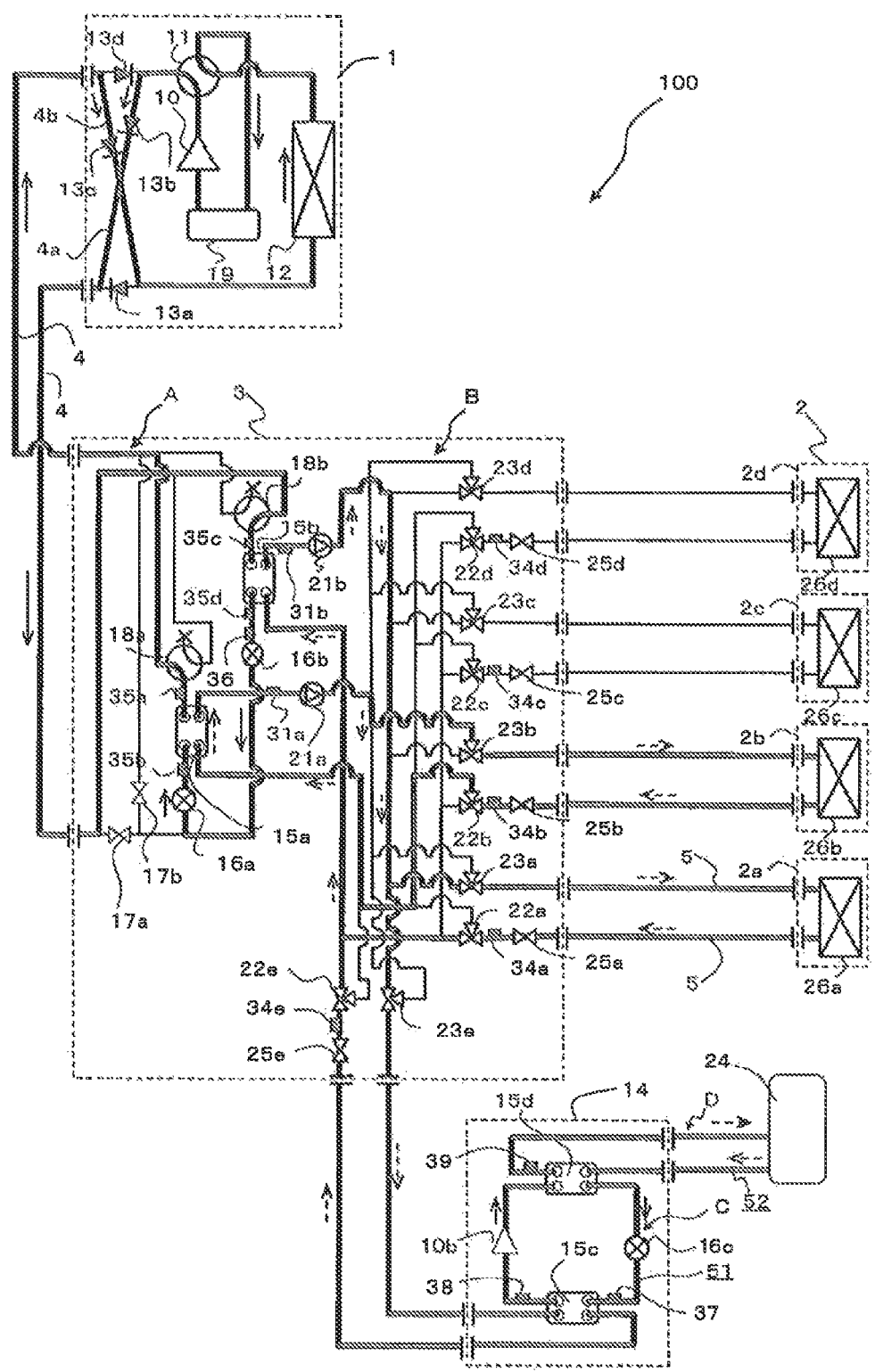
FIG. 6 is a refrigerant circuit diagram illustrating the flows of the refrigerants in a heating main operation mode of the air-conditioning apparatus according to Embodiment of the present invention.

FIG. 6 is a refrigerant circuit diagram illustrating the flows of the refrigerants in the heating main operation mode of the air-conditioning apparatus 100. The heating main operation mode will be described with respect to a case where a heating load is generated in the use side heat exchanger 26a and a cooling load is generated in the use side heat exchanger 26b in FIG. 6. In FIG. 6, pipes indicated by thick lines correspond to pipes through which the refrigerants (the heat source side refrigerant and the heat medium) circulate. Furthermore, in FIG. 6, solid-line arrows indicate a flow direction of the heat source side refrigerant and broken-line arrows indicate a flow direction of the heat medium. Furthermore, the hot water supply unit 14 is activated in the heating main operation mode.

In the heating main operation mode illustrated in FIG. 6, in the outdoor unit 1, the first refrigerant flow switching device 11 is allowed to perform switching such that the heat source side refrigerant discharged from the compressor 10a flows into the heat medium relay unit 3 without passing through the heat source side heat exchanger 12. In the heat medium relay unit 3, the pump 21a and the pump 21b are driven, the heat medium flow control device 25a, the heat medium flow control device 25b, and the heat medium flow control device 25e are opened, and the heat medium flow control device 25c and the heat medium flow control device 25d are fully closed such that the heat medium circulates between the heat exchanger related to heat medium 15a and the use side heat exchanger 26b, the heat medium circulates between the heat exchanger related to heat medium 15a and the use side heat exchanger 26b, and the heat medium circulates between the heat exchanger related to heat medium 15b and the second heat exchanger related to heat medium 15c.

First, the flow of the heat source side refrigerant in the refrigerant circuit A will be described.

A low-temperature low-pressure refrigerant is compressed by the compressor 10a and is discharged as a high-temperature high-pressure gas refrigerant therefrom. The high-temperature high-pressure gas refrigerant discharged from the compressor 10a passes through the first refrigerant flow switching device 11, flows through the first connecting pipe 4a, passes through the check valve 13b, and flows out of the outdoor unit 1. The high-temperature high-pressure gas refrigerant, which has flowed out of the outdoor unit 1, passes through the refrigerant pipe 4 and flows into the heat medium relay unit 3. The high-temperature high-pressure gas refrigerant, which has flowed into the heat medium relay unit 3, passes through the second refrigerant flow switching device 18b and flows into the heat exchanger related to heat medium 15b, functioning as a condenser.

The gas refrigerant, which has flowed into the heat exchanger related to heat medium 15b, condenses and liquefies while transferring heat to the heat medium circulating in the heat medium circuits B, such that it turns into a liquid refrigerant. The liquid refrigerant, which has flowed from the heat exchanger related to heat medium 15b, is expanded into a low-pressure two-phase refrigerant by the expansion device 16b. This low-pressure two-phase refrigerant flows through the expansion device 16a into the heat exchanger related to heat medium 15a, functioning as an evaporator. The low-pressure two-phase refrigerant, which has flowed into the heat exchanger related to heat medium 15a, removes heat from the heat medium circulating in the heat medium circuit B to cool the heat medium. This low-pressure two-phase refrigerant flows out of the heat exchanger related to heat medium 15a, passes through the second refrigerant flow switching device 18a, flows out of the heat medium relay unit 3, passes through the refrigerant pipe 4, and again flows into the outdoor unit 1.

The heat source side refrigerant, which has flowed into the outdoor unit 1, flows through the check valve 13c into the heat source side heat exchanger 12, functioning as an evaporator. The refrigerant, which has flowed into the heat source side heat exchanger 12, removes heat from the outdoor air in the heat source side heat exchanger 12, such that it turns into a low-temperature low-pressure gas refrigerant. The low-temperature low-pressure gas refrigerant, which has flowed out of the heat source side heat exchanger 12, passes through the first refrigerant flow switching device 11 and the accumulator 19 and is again sucked into the compressor 10a.

At this time, the opening degree of the expansion device 16b is controlled such that subcooling is constant, the subcooling being obtained as the difference between a saturation temperature converted from a pressure detected by the pressure sensor 36 and a temperature detected by the third temperature sensor 35b. The expansion device 16a is fully opened, the opening and closing device 17a is closed, and the opening and closing device 17b is closed. Note that the expansion device 16b may be fully opened and the expansion device 16a may control the subcooling.

Next, the flow of the heat medium in the heat medium circuits B will be described.

In the heating main operation mode, the heat exchanger related to heat medium 15b transfers heating energy of the heat source side refrigerant to the heat medium and the pump 21b allows the heated heat medium to flow through the pipes 5. Furthermore, in the heating main operation mode, the heat exchanger related to heat medium 15a transfers cooling energy of the heat source side refrigerant to the heat medium and the pump 21a allows the cooled heat medium to flow through the pipes 5. The heat medium, which has flowed out of each of the pump 21a and the pump 21b while being pressurized, flows through the second heat medium flow switching device 23a, the second heat medium flow switching device 23b, or the second heat medium flow switching device 23e into the use side heat exchanger 26a, the use side heat exchanger 26b, or the second heat exchanger related to heat medium 15c.

In the use side heat exchanger 26b, the heat medium removes heat from the indoor air, thus cooling the indoor space 7. In addition, in the use side heat exchanger 26a, the heat medium transfers heat to the indoor air, thus heating the indoor space 7. Furthermore, in the second heat exchanger related to heat medium 15c, the heat medium transfers heat to the hot water supply side refrigerant circulating in the hot water supply side refrigerant circuit C to produce hot water to be stored in the hot water storage tank 24. At this time, each of the heat medium flow control device 25a, the heat medium flow control device 25b, and the heat medium flow control device 25e allows the heat medium to be controlled at a flow rate necessary to cover a load required in the indoor space or the hot water supply unit 14, such that the controlled flow rate of heat medium flows into the use side heat exchanger 26a, the use side heat exchanger 26b, or the second heat exchanger related to heat medium 15c.

The heat medium, which has passed through the use side heat exchanger 26b with a slight increase of temperature, passes through the heat medium flow control device 25b and the first heat medium flow switching device 22b, flows into the heat exchanger related to heat medium 15a, and is then again sucked into the pump 21a. The heat medium, which has passed through the use side heat exchanger 26a with a slight decrease of temperature, passes through the heat medium flow control device 25a and the first heat medium flow switching device 22a. The heat medium, which has passed through the second heat exchanger related to heat medium 15c with a slight decrease of temperature, passes through the heat medium flow control device 25e and the first heat medium flow switching device 22e. These flows of heat medium merge together. The resultant heat medium flows into the heat exchanger related to heat medium 15b and is then again sucked into the pump 21b.

During this time, the first heat medium flow switching devices 22 and the second heat medium flow switching devices 23 allow the warm heat medium and the cold heat medium to be introduced into the use side heat exchanger 26 having a heating load and the use side heat exchanger 26 having a cooling load, respectively, without mixing with each other. Note that in the pipe 5 in each of the use side heat exchanger 26 for heating and that for cooling, the heat medium flows in a direction in which it flows from the second heat medium flow switching device 23 through the heat medium flow control device 25 to the first heat medium flow switching device 22. Furthermore, the difference between a temperature detected by the first temperature sensor 31b and that detected by the second temperature sensor 34 is controlled such that the difference is held at a target value, so that an air conditioning load required in the indoor space 7 to be heated can be covered. The difference between a temperature detected by the second temperature sensor 34 and that detected by the first temperature sensor 31a is controlled such that the difference is held at a target value, so that an air conditioning load required in the indoor space 7 to be cooled can be covered.

Upon carrying out the heating main operation mode, since it is unnecessary to supply the heat medium to each use side heat exchanger 26 having no thermal load (including thermo-off), the passage is closed by the corresponding heat medium flow control device 25 such that the heat medium does not flow into the use side heat exchanger 26. In FIG. 6, the heat medium flows into the use side heat exchanger 26a, the use side heat exchanger 26b, and the second heat exchanger related to heat medium 15c because these heat exchangers each have a thermal load. The use side heat exchanger 26c and the use side heat exchanger 26d have no thermal load and the corresponding heat medium flow control devices 25c and 25d are fully closed. When a thermal load is generated in the use side heat exchanger 26c or the use side heat exchanger 26d, the heat medium flow control device 25c or the heat medium flow control device 25d may be opened such that the heat medium is circulated.

[Refrigerant Pipes 4]

As described above, the air-conditioning apparatus 100 according to Embodiment has the several operation modes. In these operation modes, the heat source side refrigerant (first refrigerant) flows through the refrigerant pipes 4 connecting the outdoor unit 1 and the heat medium relay unit 3.

[Pipes 5]

In the several operation modes carried out by the air-conditioning apparatus 100 according to Embodiment, the heat medium (first heat medium), such as water or antifreeze, flows through the pipes 5 connecting the heat medium relay unit 3 and the indoor units 2.

[Hot Water Supply Side Refrigerant Pipes 51]

In the several operation modes carried out by the air-conditioning apparatus 100 according to Embodiment, the hot water supply side refrigerant (second refrigerant) flows through the hot water supply side refrigerant pipes 51 connecting the components constituting the hot water supply side refrigerant circuit C.

[Second Heat Medium Pipes 52]

In the several operation modes carried out by the air-conditioning apparatus 100 according to Embodiment, the heat medium (second heat medium), such as water or antifreeze, flows through the second heat medium pipes 52 connecting the components constituting the hot water circuit D.

[Detailed Description of Hot Water Supply Unit 14]

A low-temperature low-pressure hot water supply side refrigerant is compressed by the compressor 10b and is discharged as a high-temperature high-pressure gas refrigerant therefrom. The high-temperature high-pressure gas refrigerant discharged from the compressor 10b flows into the third heat exchanger related to heat medium 15d, functioning as a condenser. The gas refrigerant, which has flowed into the third heat exchanger related to heat medium 15d, condenses and liquefies while transferring heat to the second heat medium flowing in the hot water circuit D, such that it turns into a liquid refrigerant. This liquid refrigerant is expanded into a low-pressure two-phase refrigerant by the second expansion device 16c. This low-pressure two-phase refrigerant flows into the second heat exchanger related to heat medium 15c, functioning as an evaporator. The low-pressure two-phase refrigerant, which has flowed into the second heat exchanger related to heat medium 15c, removes heat from the heat medium circulating in the heat medium circuits B, such that it evaporates and gasifies. This gas refrigerant is again sucked into the compressor 10b.

In this case, in the second heat exchanger related to heat medium 15c, the hot water supply side refrigerant removes heat from the heat medium (first heat medium) to consume it as energy for evaporation of the hot water side refrigerant. In the third heat exchanger related to heat medium 15d, the hot water supply side refrigerant (second refrigerant) transfers heat to the second heat medium to heat the second heat medium, thus producing the warm second heat medium. The produced second heat medium flows in the hot water circuit D and is stored in the hot water storage tank 24.

The second expansion device 16c is a component having a controllable opening degree, such as a stepping motor and its opening degree is controlled such that the difference between a temperature detected by the fifth temperature sensor 38 for the second heat exchanger related to heat medium 15c and that detected by the fourth temperature sensor 37 for the second heat exchanger related to heat medium 15c is constant. The compressor 10b is a frequency-controllable component of, for example, inverter-driven type and its frequency is controlled such that a temperature detected by the sixth temperature sensor 39 for the third heat exchanger related to heat medium 15d is at a target temperature.

Note that the first refrigerant (heat source side refrigerant) circulating between the outdoor unit 1 and the heat medium relay unit 3 is independent of the second refrigerant (hot water supply side refrigerant) used in the hot water supply unit 14 such that the first and second refrigerants do not mix with each other. As regards the first refrigerant and the second refrigerant, the same refrigerant may be used, or different refrigerants may be used.

Similarly, the first heat medium circulating between the heat medium relay unit 3 and the use side heat exchangers 26 in the indoor units 2 or the second heat exchanger related to heat medium 15c in the hot water supply unit 14 is independent of the second heat medium circulating between the hot water storage tank 24 and the third heat exchanger related to heat medium 15d in the hot water supply unit 14 such that these heat media do not mix with each other. As regards the first heat medium and the second heat medium, the same heat medium may be used, or different heat media may be used.

Since the second heat medium is mainly used to cover a hot water supply load, a set target temperature of the second heat medium flowing through the third heat exchanger related to heat medium 15d is higher than that of the first heat medium flowing through the second heat exchanger related to heat medium 15c. For example, when the target temperature of the first heat medium flowing through the second heat exchanger related to heat medium 15c is set to 50° C., the target temperature of the second heat medium flowing through the third heat exchanger related to heat medium 15d is set to, for example, 70° C. Accordingly, a condensing temperature or pseudo-condensing temperature of the second refrigerant used in the hot water supply unit 14 is controlled at a value higher than a condensing temperature or pseudo-condensing temperature of the first refrigerant circulating between the outdoor unit 1 and the heat medium relay unit 3. For example, when the condensing temperature or pseudo-condensing temperature of the second refrigerant is 75° C., the condensing temperature or pseudo-condensing temperature of the first refrigerant circulating between the outdoor unit 1 and the heat medium relay unit 3 is set to, for example, 55° C.

Additionally, the hot water supply unit 14 is connected to the heat medium relay unit 3 such that the unit is in parallel to the indoor units 2, and operates in a manner similar to the indoor units 2. In other words, the controller (not illustrated) provided for the hot water supply unit 14 is connected to the controller (not illustrated) provided for the heat medium relay unit 3 or the outdoor unit 1 such that the controllers can communicate with each other by wire or wireless to determine operations of the components and enable control in cooperation with each other. For example, since heating energy is not produced in the cooling only operation mode, the hot water supply unit 14 is suspended. When the hot water supply unit 14 is operated, the operation mode is set to the heating only operation mode, the cooling main operation mode, or the heating main operation mode on the basis of the sum of loads in the hot water supply unit 14 and the indoor units 2 such that the components are operated in accordance with the set operation mode.

To reduce pressure loss of the heat medium in the pipes 5 in the use side heat exchangers 26a to 26d, a target value of inlet-outlet heat medium temperature differences of the use side heat exchangers 26a to 26d is set to a slightly larger value, each inlet-outlet heat medium temperature difference being obtained as the difference between a temperature detected by the corresponding one of the second temperature sensors 34a to 34d and a temperature detected by the first temperature sensor 31a or the first temperature sensor 31b.

The heat medium flow control devices 25a to 25d are controlled to reduce a flow velocity of the heat medium. The use side heat exchangers 26a to 26d are designed so as to exhibit an optimum performance at a controlled flow velocity.

In a passage for the first heat medium of the second heat exchanger related to heat medium 15c in the hot water supply unit 14, the difference in heat medium temperature between an inlet and an outlet of the second heat exchanger related to heat medium 15c occurs. The first heat medium, such as water or brine, undergoes a single phase change (i.e., does not undergo a two-phase change) and the hot water supply side refrigerant (second refrigerant) undergoes a two-phase change or a transition to a supercritical state. In the hot water supply unit 14, therefore, if a heat exchanger having a capacity similar to that of a heat exchanger that exchanges heat between refrigerants is used as a heat exchanger related to heat medium, heat transfer performance would be reduced unless a flow velocity of the heat medium in the second heat exchanger related to heat medium 15c is increased.

A control target temperature difference for the heat medium flow control device 25e connected to the passage for the first heat medium of the second heat exchanger related to heat medium 15c therefore has to be smaller than a control target temperature difference for the heat medium flow control devices 25a to 25d connected to the use side heat exchangers 26a to 26d. For example, control may be performed such that the control target temperature difference for the heat medium flow control devices 25a to 25d is set to 7° C. and that for the heat medium flow control device 25e is set to 3° C. This will allow the heat medium in the passage for the first heat medium of the second heat exchanger related to heat medium 15c in the hot water supply unit 14 to be controlled at a high flow velocity, thus improving the heat transfer performance. A high performance system can be provided.

To prevent a reduction in performance of the second heat exchanger related to heat medium 15c in the hot water supply unit 14, the second heat exchanger related to heat medium 15c may be connected such that a flow direction of the first heat medium is counter to that of the second refrigerant in the second heat exchanger related to heat medium 15c irrespective of an operation state (the heating only operation, the heating main operation, or the cooling main operation) in the heat source side refrigerant circuit. This will allow the system to provide high performance at any time without reducing the heat transfer performance of the second heat exchanger related to heat medium 15c in the hot water supply unit 14.

While the case where the hot water supply side refrigerant circuit C is connected to the passage for the first heat medium has been described on the assumption that the hot water supply unit 14 heats the second heat medium in the hot water supply side refrigerant circuit C, the assumption is not limited to this. For example, the hot water supply unit 14 may be allowed to function as a second air-conditioning apparatus in FIG. 2. In this case, the third heat exchanger related to heat medium 15d in the hot water supply unit 14 can be used as a heat exchanger that exchanges heat between the hot water supply side refrigerant and air. The third heat exchanger related to heat medium 15d can be configured to condition air in a space which hates water to flow therethrough, for example, a computer room. This configuration can therefore provide a safe system because if the refrigerant in the hot water supply side refrigerant circuit C leaks, the amount of the hot water supply side refrigerant is small.

In the air-conditioning apparatus 100, in the case where only the heating load or cooling load is generated in the use side heat exchangers 26, the corresponding first heat medium flow switching devices 22 and the corresponding second heat medium flow switching devices 23 are controlled at a medium opening degree, such that the heat medium flows into both the heat exchanger related to heat medium 15a and the heat exchanger related to heat medium 15b. Consequently, since both the heat exchanger related to heat medium 15a and the heat exchanger related to heat medium 15b can be used for the heating operation or the cooling operation, the area of heat transfer is increased, so that the heating operation or the cooling operation can be efficiently performed.

In addition, in the case where the heating load and the cooling load are simultaneously generated in the use side heat exchangers 26, the first heat medium flow switching device 22 and the second heat medium flow switching device 23 corresponding to the use side heat exchanger 26 which performs the heating operation are switched to the passage connected to the heat exchanger related to heat medium 15b for heating, and the first heat medium flow switching device 22 and the second heat medium flow switching device 23 corresponding to the use side heat exchanger 26 which performs the cooling operation are switched to the passage connected to the heat exchanger related to heat medium 15a for cooling, so that the heating operation or cooling operation can be freely performed in each indoor unit 2.

Furthermore, each of the first heat medium flow switching devices 22 and the second heat medium flow switching devices 23 described in Embodiment may include a component which can switch between passages, for example, a three-way valve capable of switching between flow directions in a three-way passage or two two-way valves, such as on-off valves, opening or closing a two-way passage used in combination. Alternatively, as each of the first heat medium flow switching devices 22 and the second heat medium flow switching devices 23, a component, such as a stepping-motor-driven mixing valve, capable of changing a flow rate in a three-way passage may be used, or, two components, such as electronic expansion valves, capable of changing a flow rate in a two-way passage may be used in combination. In this case, water hammer caused when a passage is suddenly opened or closed can be prevented. Furthermore, while Embodiment has been described with respect to the case where the heat medium flow control devices 25 each include a two-way valve, each of the heat medium flow control devices 25 may include a control valve having a three-way passage and the valve may be disposed with a bypass pipe that bypasses the corresponding use side heat exchanger 26.

Furthermore, as regards each of the heat medium flow control devices 25, a component capable of controlling a flow rate in a passage in a stepping-motor-driven manner may be used. Alternatively, a two-way valve or a three-way valve whose one end is closed may be used. Alternatively, as regards each of the heat medium flow control devices 25, a component, such as an on-off valve, opening or closing a two-way passage may be used such that an average flow rate is controlled while ON and OFF operations are repeated.

Furthermore, while each second refrigerant flow switching device 18 is illustrated as a four-way valve, the device is not limited to this valve. A plurality of two-way or three-way flow switching valves may be used such that the refrigerant flows in the same way.

While the air-conditioning apparatus 100 according to Embodiment has been described with respect to the case where the apparatus can perform the cooling and heating mixed operation, the apparatus is not limited to this case. For example, if the apparatus is configured such that one heat exchanger related to heat medium 15 and one expansion device 16 are arranged, each device is connected to a plurality of use side heat exchangers 26 arranged in parallel and a plurality of heat medium flow control devices 25 arranged in parallel, and either the cooling operation or the heating operation can be performed, the same advantages can be achieved.

In addition, it is needless to say that the same holds true for the case where one use side heat exchanger 26 and one heat medium flow control device 25 are connected. Moreover, obviously, no problem will arise if a plurality of components acting in the same way are arranged as each of the heat exchanger related to heat medium 15 and the expansion device 16. Furthermore, while the case where the heat medium flow control devices 25 are arranged in the heat medium relay unit 3 has been described, the arrangement is not limited to this case. Each heat medium flow control device 25 may be disposed in the indoor unit 2. The heat medium relay unit 3 may be separated from the indoor unit 2.

As regards the heat source side refrigerant which is the first refrigerant, a single refrigerant, such as R-22, R-134a, or R-32, a near-azeotropic refrigerant mixture, such as R-410A or R-404A, a non-azeotropic refrigerant mixture, such as R-407C, tetrafluoropropene (HFO-1234yf or HFO-1234ze) that is a refrigerant which contains a double bond in its chemical formula and is expressed in the chemical formula $C_3H_2F_4$ and has a relatively low global warming potential, a mixture containing the refrigerant, or a natural refrigerant, such as $CO_2$ or propane, can be used. In the heat exchanger related to heat medium 15a or the heat exchanger related to heat medium 15b which operates for heating, a refrigerant that typically undergoes a two-phase change condenses and liquefies and a refrigerant, such as $CO_2$, which undergoes a transition to a supercritical state is cooled in the supercritical state. As for the rest, either of them acts in the same way and offers the same advantages. Considering the global environmental aspect, it is preferable to use R-32 having a low global warming potential or, for example, a refrigerant mixture containing R-32 and tetrafluoropropene (HFO-1234yf or HFO-1234ze).

As regards the hot water supply side refrigerant which is the second refrigerant, the same refrigerant as the heat source side refrigerant can be used. Since the hot water supply unit 14 is used to produce a high-temperature heat medium (second heat medium), however, it is preferable to use R134a, tetrafluoropropene (HFO-1234yf or HFO-1234ze), serving as a refrigerant which contains a double bond in its chemical formula and is expressed in the chemical formula $C_3H_2F_4$, a mixture containing the refrigerant, or a $CO_2$ refrigerant operating in the supercritical state. It is more preferable to use R134a or tetrafluoropropene (HFO-1234yf or HFO-1234ze) because a higher-temperature heat medium can be produced. Considering the global environmental aspect, tetrafluoropropene (HFO-1234yf or HFO-1234ze) having a low global warming potential or, for example, a refrigerant mixture containing tetrafluoropropene as a major component and a refrigerant, such as R-32, as a minor component is the most preferable.

As regards the first heat medium, for example, brine (antifreeze), water, a mixed solution of brine and water, or a mixed solution of water and an additive with a high corrosion protection effect can be used. In the air-conditioning apparatus 100, therefore, if the heat medium leaks through the indoor unit 2 into the indoor space 7, the safety of the heat medium used is high. Accordingly, it contributes to safety improvement.

As regards the second heat medium, the same as the first heat medium can be used. It is, however, preferable to use water as a substance to be stored in the hot water storage tank 24.

While Embodiment has been described with respect to the case where the air-conditioning apparatus 100 includes the accumulator 19, the accumulator 19 may be omitted. Typically, each of the heat source side heat exchanger 12 and the use side heat exchangers 26 is provided with an air-sending device and a current of air often facilitates condensation or evaporation. The structure is not limited to this case. For example, a heat exchanger, such as a panel heater, using radiation can be used as the use side heat exchanger 26 and a water-cooled heat exchanger which transfers heat using water or antifreeze can be used as the heat source side heat exchanger 12. In other words, any type heat exchanger configured to be capable of transferring heat or removing heat can be used as each of the heat source side heat exchanger 12 and the use side heat exchanger 26.

While Embodiment has been described with respect to the case where the four use side heat exchangers 26 are arranged, the number of use side heat exchangers is not particularly limited. In addition, while Embodiment has been described with respect to the case where the two heat exchangers related to heat medium 15a and 15b are arranged, obviously, the arrangement is not limited to this case. As long as each heat exchanger related to heat medium 15 is configured to be capable of cooling or/and heating the heat medium, the number of heat exchangers related to heat medium 15 arranged is not limited. Furthermore, as regards each of the pump 21a and the pump 21b, the number of pumps is not limited to one. A plurality of pumps having a small capacity may be connected in parallel.

As described above, the air-conditioning apparatus 100 according to Embodiment can achieve safety improvement without allowing the heat source side refrigerant to circulate in or near the indoor unit 2 and can further allow the heat medium leaked from connection between the pipe 5 and each actuator to be held in the heat medium relay unit 3, thus further improving the safety. Additionally, the air-conditioning apparatus 100 can achieve energy saving because the pipes 5 can be made shorter. Moreover, the air-conditioning apparatus 100 includes a reduced number of pipes (the refrigerant pipes 4, the pipes 5) connecting the outdoor unit 1 and the heat medium relay unit 3 or connecting the heat medium relay unit 3 and the indoor unit 2 to provide improved ease of construction. Additionally, the air-conditioning apparatus 100 can achieve safety improvement and high efficiency because the apparatus once transfers energy to a heat medium other than a refrigerant and again introduces the heat medium into another refrigeration cycle.

REFERENCE SIGNS LIST

1, outdoor unit; 2, indoor unit; 2a, indoor unit; 2b, indoor unit; 2c, indoor unit; 2d, indoor unit; 3, heat medium relay unit; 4 refrigerant pipe; 4a, first connecting pipe; 4b, second connecting pipe; 5, pipe; 6, outdoor space; 7, indoor space; 8, space; 9, structure; 10a, compressor; 10b, compressor; 11, first refrigerant flow switching device; 12, heat source side heat exchanger; 13a, check valve; 13b, check valve; 13c, check valve; 13d, check valve; 14, hot water supply unit; 15, first heat exchanger related to heat medium; 15a, heat exchanger related to heat medium; 15b, heat exchanger related to heat medium; 15c, second heat exchanger related to heat medium; 15d, third heat exchanger related to heat medium; 16, first expansion device; 16a, expansion device; 16b, expansion device; 16c, second expansion device; 17, opening and closing device; 17a, opening and closing device; 17b, opening and closing device; 18, second refrigerant flow switching device; 18a, second refrigerant flow switching device; 18*b*, second refrigerant flow switching device; 19, accumulator; 21, pump; 21*a*, pump; 21*b*, pump; 22, first heat medium flow switching device; 22*a*, first heat medium flow switching device; 22*b*, first heat medium flow switching device; 22*c*, first heat medium flow switching device; 22*d*, first heat medium flow switching device; 22*e*, first heat medium flow switching device; 23, second heat medium flow switching device; 23*a*, second heat medium flow switching device; 23*b*, second heat medium flow switching device; 23*c*, second heat medium flow switching device; 23*d*, second heat medium flow switching device; 23*e*, second heat medium flow switching device; 24, hot water storage tank; 25, heat medium flow control device; 25*a*, heat medium flow control device; 25*b*, heat medium flow control device; 25*c*, heat medium flow control device; 25*d*, heat medium flow control device; 25*e*, heat medium flow control device; 26, use side heat exchanger; 26*a*, use side heat exchanger; 26*b*, use side heat exchanger; 26*c*, use side heat exchanger; 26*d*, use side heat exchanger; 31, first temperature sensor; 31*a*, first temperature sensor; 31*b*, first temperature sensor; 34, second temperature sensor; 34*a*, second temperature sensor; 34*b*, second temperature sensor; 34*c*, second temperature sensor; 34*d*, second temperature sensor; 34*e*, second temperature sensor; 35, third temperature sensor; 35*a*, third temperature sensor; 35*b*, third temperature sensor; 35*c*, third temperature sensor; 35*d*, third temperature sensor; 36, pressure sensor; 37, fourth temperature sensor; 38, fifth temperature sensor; 39, sixth temperature sensor; 51, hot water supply side refrigerant pipe; 52, second heat medium pipe; 100, air-conditioning apparatus; A, refrigerant circuit; B, heat medium circuit; C, hot water supply side refrigerant circuit; and D, hot water circuit.

The invention claimed is:

1. An air-conditioning apparatus comprising:
a first refrigerant circuit in which a first compressor, a first refrigerant flow switching device, a heat source side heat exchanger, a plurality of first expansion devices, and refrigerant side passages of a plurality of first heat exchangers related to heat medium are connected by refrigerant pipes to circulate a first refrigerant;
a first heat medium circuit in which a pump, a use side heat exchanger, heat medium side passages of the plurality of first heat exchangers related to heat medium, a heat medium flow control device disposed on an inlet side or an outlet side of the use side heat exchanger, and heat medium flow switching devices arranged on the inlet side and the outlet side of the use side heat exchanger are connected by heat medium pipes, and the pump, a heat medium side passage of a second heat exchanger related to heat medium, the heat medium side passages of the plurality of first heat exchangers related to heat medium, a heat medium flow control device disposed on an inlet side or an outlet side of the heat medium side passage of the second heat exchanger related to heat medium, and heat medium flow switching devices arranged on the inlet side and the outlet side of the heat medium side passage of the second heat exchanger related to heat medium are connected by heat medium pipes to circulate a first heat medium; and
a second refrigerant circuit in which a second compressor, a refrigerant side passage of a third heat exchanger related to heat medium, a second expansion device, and a refrigerant side passage of the second heat exchanger related to heat medium are connected by refrigerant pipes to circulate a second refrigerant,
the plurality of first heat exchangers related to heat medium exchange heat between the first refrigerant and the first heat medium and the second heat exchanger related to heat medium exchanges heat between the first heat medium and the second refrigerant to prevent the first refrigerant and the second refrigerant from mixing with each other,
a second heat medium is allowed to flow through a heat medium side passage of the third heat exchanger related to heat medium,
the third heat exchanger related to heat medium exchanges heat between the second refrigerant and the second heat medium to prevent the first heat medium and the second heat medium from mixing with each other,
the first refrigerant and the second refrigerant undergo a two-phase change or a transition to a supercritical state during circulating in the first refrigerant circuit and the second refrigerant circuit, respectively,
the first heat medium, in the heat medium side passage of the second heat exchanger related to heat medium, undergoes a single phase change, and
the first heat medium and the second heat medium do not undergo a two-phase change or a transition to a supercritical state during circulating in the first heat medium circuit and circulating through the heat medium side passage of the third heat exchanger related to heat medium, respectively.

2. The air-conditioning apparatus of claim 1, wherein in an operation in which the first refrigerant discharged from the first compressor is allowed to flow through at least part of the plurality of first heat exchangers related to heat medium in order to heat the first heat medium, a condensing temperature or pseudo-condensing temperature of the second refrigerant is controlled so as to be higher than a condensing temperature or pseudo-condensing temperature of the first refrigerant.

3. The air-conditioning apparatus of claim 1, wherein in an operation in which the first refrigerant discharged from the first compressor is allowed to flow through at least part of the plurality of first heat exchangers related to heat medium in order to heat the first heat medium, a temperature of the second heat medium at an outlet of the heat medium side passage of the third heat exchanger related to heat medium is controlled so as to be higher than a temperature of the first heat medium at an outlet of the heat medium side passages of the plurality of the first heat exchangers related to heat medium.

4. The air-conditioning apparatus of claim 1, further comprising:
a first controller that controls an operation of the first refrigerant circuit and a second controller that controls an operation of the second refrigerant circuit,
the first controller and the second controller control the operations of the refrigerant circuits in cooperation with each other by wire or wireless communication.

5. The air-conditioning apparatus of claim 1, the heat medium flow control devices are controlled such that a control target inlet-outlet temperature difference for the heat medium flow control device connected to the heat medium side passage of the second heat exchanger related to heat medium is smaller than a control target inlet-outlet temperature difference for the heat medium flow control device connected to the use side heat exchanger.

6. The air-conditioning apparatus of claim 1, further comprising
a plurality of second refrigerant flow switching devices that switch between circulation passages for the first refrigerant are arranged in the first refrigerant circuit, and
the plurality of second refrigerant flow switching devices allow switching between operation modes including:

a heating only operation mode in which the first heat medium is heated by all of the plurality of first heat exchangers related to heat medium, a cooling only operation mode in which the first heat medium is cooled by all of the plurality of first heat exchangers related to heat medium, and a cooling and heating mixed operation mode in which the first heat medium is heated by part of the plurality of first heat exchangers related to heat medium and the first heat medium is cooled by rest of the plurality of first heat exchangers related to heat medium.

7. The air-conditioning apparatus of claim 1, a flow direction of the first heat medium is counter to a flow direction of the second refrigerant in the second heat exchanger related to heat medium.

8. The air-conditioning apparatus of claim 1, further comprising:

an indoor unit including the use side heat exchanger;

a hot water supply unit including the second heat exchanger related to heat medium, the third heat exchanger related to heat medium, the second compressor, and the second expansion device;

a heat medium relay unit including at least the plurality of first heat exchangers related to heat medium and the pump; and an outdoor unit including the first compressor and the heat source side heat exchanger, the indoor unit, the hot water supply unit, the heat medium relay unit, and the outdoor unit are separated from one another such that they are allowed to be arranged at separate positions.

9. The air-conditioning apparatus of claim 8, the outdoor unit is connected to the heat medium relay unit by two pipes, the heat medium relay unit is connected to the indoor unit by two pipes, and the heat medium relay unit is connected to the hot water supply unit by two pipes.

10. The air-conditioning apparatus of claim 1, the first refrigerant that circulates in the refrigerant side passages of the plurality of first heat exchangers related to heat medium is R-32 or a refrigerant mixture containing at least R-32 and tetrafluoropropene, and the second refrigerant that circulates in the second refrigerant circuit is tetrafluoropropene or a refrigerant mixture containing tetrafluoropropene as a major component.

* * * * *